(12) United States Patent
Lee et al.

(10) Patent No.: US 11,107,421 B2
(45) Date of Patent: Aug. 31, 2021

(54) DISPLAY DEVICE

(71) Applicant: SAMSUNG DISPLAY CO., LTD., Yongin-si (KR)

(72) Inventors: Hae Yeon Lee, Yongin-si (KR); Won Kyu Kwak, Yongin-si (KR); Joong Soo Moon, Yongin-si (KR); Chang Kyu Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/436,216

(22) Filed: Jun. 10, 2019

(65) Prior Publication Data

US 2019/0295475 A1 Sep. 26, 2019

Related U.S. Application Data

(63) Continuation of application No. 15/782,658, filed on Oct. 12, 2017, now Pat. No. 10,319,308.

(30) Foreign Application Priority Data

Dec. 12, 2016 (KR) .......................... 10-2016-0168459

(51) Int. Cl.
*H01L 27/12* (2006.01)
*G09G 3/3291* (2016.01)
(Continued)

(52) U.S. Cl.
CPC ..... *G09G 3/3291* (2013.01); *G02F 1/136227* (2013.01); *G09G 3/3225* (2013.01);
(Continued)

(58) Field of Classification Search
CPC ............ H01L 27/1244; H01L 27/1214; H01L 27/1218; H01L 27/3276; G09G 3/3283;
(Continued)

(56) References Cited

U.S. PATENT DOCUMENTS 8,791,455 B2 7/2014 Kim et al.
9,082,667 B2 7/2015 Youn et al.
(Continued)

FOREIGN PATENT DOCUMENTS

EP 3051333 A1 8/2016
KR 10-1372505 B1 3/2014
(Continued)

OTHER PUBLICATIONS

EPO Extended Search Report dated May 16, 2018, for corresponding European Patent Application No. 17206644.1 (9 pages).

*Primary Examiner* — Grant S Withers
(74) *Attorney, Agent, or Firm* — Lewis Roca Rothgerber Christie LLP

(57) ABSTRACT

A display device includes a substrate including a bent area, and a flat area including a plurality of pixels, a plurality of island-shaped inorganic insulating patterns arranged on the substrate in the bent area to be separate from each other, an organic insulating layer including a concavo-convex surface covering the inorganic insulating patterns in the bent area, and wiring lines arranged on the organic insulating layer and overlapping the inorganic insulating patterns.

24 Claims, 12 Drawing Sheets

(51) Int. Cl.
*H01L 27/32* (2006.01)
*G02F 1/1362* (2006.01)
*G09G 3/3225* (2016.01)
*H01L 51/00* (2006.01)
*H01L 51/52* (2006.01)
*H01L 51/56* (2006.01)

(52) U.S. Cl.
CPC ...... *H01L 27/3276* (2013.01); *H01L 51/0097* (2013.01); *H01L 51/5203* (2013.01); *H01L 51/56* (2013.01); *G09G 2300/0426* (2013.01); *G09G 2380/02* (2013.01); *H01L 2251/5338* (2013.01)

(58) Field of Classification Search
CPC .............. G09G 3/3225; G09G 3/3233; G09G 2300/0426

See application file for complete search history.

(56) References Cited

U.S. PATENT DOCUMENTS

| | | | |
|---|---|---|---|
| 10,734,471 B2* | 8/2020 | Park | H01L 27/3248 |
| 2014/0055702 A1 | 2/2014 | Park et al. | |
| 2014/0217397 A1 | 8/2014 | Kwak et al. | |
| 2014/0232956 A1 | 8/2014 | Kwon et al. | |
| 2015/0187279 A1 | 7/2015 | Lee et al. | |
| 2015/0228927 A1* | 8/2015 | Kim | H01L 51/5203 |
| | | | 257/40 |
| 2016/0064466 A1 | 3/2016 | Son et al. | |
| 2016/0218305 A1 | 7/2016 | Kim et al. | |
| 2018/0088390 A1* | 3/2018 | Ohara | H01L 51/0097 |
| 2018/0108863 A1* | 4/2018 | Kajiyama | H01L 51/5253 |

FOREIGN PATENT DOCUMENTS

| | | |
|---|---|---|
| KR | 10-2014-0045193 A | 4/2014 |
| KR | 10-2014-0099139 A | 8/2014 |
| KR | 10-2014-0103025 A | 8/2014 |
| KR | 10-2014-0140150 A | 12/2014 |
| KR | 10-2015-0079206 A | 7/2015 |
| KR | 10-2016-0092140 A | 8/2016 |

* cited by examiner

DISPLAY DEVICE

CROSS-REFERENCE TO RELATED APPLICATIONS

This application is a continuation of U.S. patent application Ser. No. 15/782,658, filed on Oct. 12, 2017, which claims priority to and the benefit of Korean Patent Application No. 10-2016-0168459, filed on Dec. 12, 2016 in the Korean Intellectual Property Office, the entire content of each of which is incorporated herein by reference.

BACKGROUND

1. Field

Aspects of embodiments of the present invention relate to a display device.

2. Description of the Related Art

Recently, flexible display devices that may be bent or folded when users desire to curve or fold the display devices are being developed.

When the display devices are bent or folded, bent or folded areas of the display devices are vulnerable to stress such that the display devices may be transformed or damaged. In particular, when stress associated with transformation is applied to wiring lines of the bent or folded areas, the wiring lines may be broken.

Therefore, characteristics and reliability of the display devices may deteriorate.

SUMMARY

According to an aspect of embodiments of the present invention, a display device is capable of preventing or substantially preventing wiring lines from being broken when the wiring lines are bent and preventing or substantially preventing a characteristic and reliability of the display device from deteriorating.

A display device according to one or more embodiments of the present invention includes: a substrate including a bent area, and a flat area including a plurality of pixels; a plurality of island-shaped inorganic insulating patterns arranged on the substrate in the bent area to be separate from each other; an organic insulating layer including a concavo-convex surface covering the inorganic insulating patterns in the bent area; and wiring lines arranged on the organic insulating layer and overlapping the inorganic insulating patterns.

The wiring lines may include a concavo-convex part over the concavo-convex surface of the organic insulating layer.

The inorganic insulating patterns may include at least two sequentially stacked inorganic insulating layers.

Each of the plurality of pixels may include a transistor provided on the substrate and an emission element connected to the transistor. The transistor may include a buffer layer provided on the substrate, an active pattern provided on the buffer layer, a gate electrode provided on a gate insulating layer on the active pattern, an interlayer insulating layer provided on the gate electrode, an insulating layer provided on the interlayer insulating layer, and a source electrode and a drain electrode provided on the insulating layer. The buffer layer, the gate insulating layer, and the interlayer insulating layer may include openings that expose the substrate in the bent area.

The inorganic insulating patterns provided in the openings may include a first inorganic insulating layer provided on the substrate and a second inorganic insulating layer provided on the first inorganic insulating layer.

The first inorganic insulating layer may include a same material as the buffer layer. The second inorganic insulating layer may include a same material as the gate insulating layer.

The inorganic insulating patterns may further include a third inorganic insulating layer provided on the second inorganic insulating layer.

The third inorganic insulating layer may include a same material as the interlayer insulating layer.

The organic insulating layer may extend from the insulating layer and fill the openings.

The insulating layer may include an inorganic material and expose the substrate to correspond to the openings.

The organic insulating layer may be a fill insulating layer including an organic material, which fills the openings.

The inorganic insulating patterns may further include a fourth inorganic insulating layer provided on the third inorganic insulating layer.

The fourth inorganic insulating layer may include a same material as the insulating layer.

In a direction vertical to a direction in which the wiring lines extend, a width of the wring lines may be not more than a width of the inorganic insulating patters.

In the direction in which the wiring lines extend, a first distance between the adjacent inorganic insulating patterns may be not more than 50% of a sum of the width of the wiring lines in the direction vertical to the direction in which the wiring lines extend and the width of the inorganic insulating patterns.

In the direction vertical to the direction in which the wiring lines extend, a second distance between the adjacent inorganic insulating patterns may be substantially equal to the first distance.

A thickness of the organic insulating layer may be not more than 1.5 times a thickness of the inorganic insulating patterns.

The thickness of the inorganic insulating patterns may be not less than 10% of the width of the wiring lines and the width of the inorganic insulating patterns.

The thickness of the inorganic insulating patterns may be not less than 8,000 Å.

In a direction in which the wiring lines extend, each of the inorganic insulating patterns may overlap one of the wiring lines.

In a direction vertical to the direction in which the wiring lines extend, each of the inorganic insulating patterns may overlap one of the wiring lines.

In a direction vertical to the direction in which the wiring lines extend, each of the inorganic insulating patterns may overlap a plurality of the wiring lines.

The inorganic insulating patterns may include a first inorganic insulating pattern provided on the substrate and at least one second inorganic insulating pattern provided on the first inorganic insulating pattern.

The at least one inorganic insulating pattern may include at least two second inorganic insulating patterns. In the direction in which the wiring lines extend, the at least two second inorganic insulating patterns may be separate from each other.

The at least one second inorganic insulating pattern may include at least two inorganic insulating layers.

A display device according to one or more embodiments of the present invention includes: a substrate including a bent area and a flat area; a buffer layer provided on the substrate; an active pattern provided on the buffer layer in the flat area; a gate insulating layer provided on the active pattern; a gate electrode provided on the gate insulating layer in the flat area; an interlayer insulating layer provided on the gate electrode; a first insulating layer provided on the interlayer insulating layer; a source electrode and a drain electrode arranged on the first insulating layer to be separate from each other and connected to the active pattern in the flat area; a second insulating layer provided on the drain electrode and including an organic material; an emission element provided on the second insulating layer and connected to the drain electrode in the flat area; an opening through areas of the buffer layer, the gate insulating layer, and the interlayer insulating layer, which correspond to the bent area; a plurality of island-shaped inorganic insulating patterns arranged in the opening to be separate from each other; an organic insulating layer configured to fill the opening and to cover the inorganic insulating patterns; and wiring lines arranged on the organic insulating layer, the organic insulating layer including a concavo-convex surface due to the inorganic insulating patterns, and the wiring lines including a concavo-convex part over the concavo-convex surface of the organic insulating layer.

In the display device according to aspects of the present invention, the wiring lines may be prevented from being broken when the wiring lines are bent, and, therefore, the characteristic and reliability of the display device may be prevented from deteriorating.

BRIEF DESCRIPTION OF THE DRAWINGS

Some example embodiments will be described more fully herein with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. Like reference numerals refer to like elements throughout.

DETAILED DESCRIPTION

Figure 1:
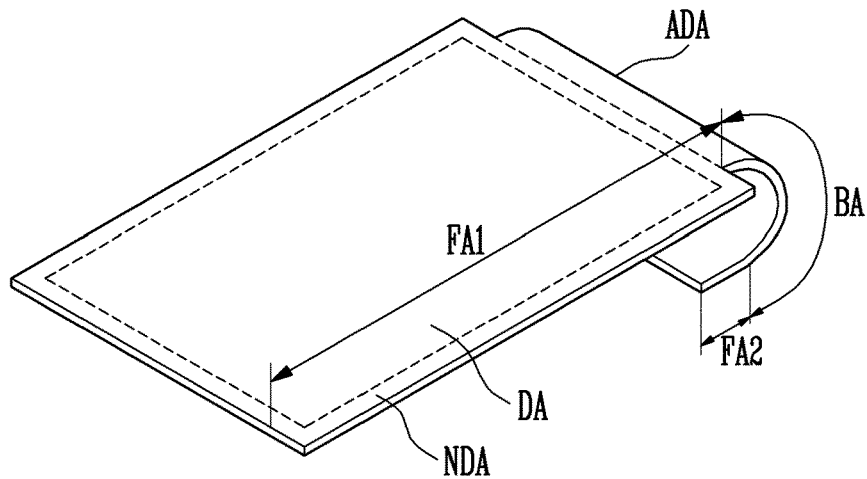
FIG. 1 is a perspective view illustrating a display device according to an embodiment of the present invention.

The present invention may be modified in various ways and may have various embodiments, some particular examples of which are illustrated in the drawings and described in further detail herein. However, it is to be understood that the present invention is not limited to a specific disclosed form, but includes all modifications, equivalents, and substitutions without departing from the scope and spirit of the present invention.

In describing drawings, like numbers refer to like elements. In the accompanying drawings, dimensions of structures may be exaggerated to clarify the present invention. While terms such as "first" and "second," etc., may be used to describe various elements, such elements are not to be understood as being limited to the above terms. The above terms are used only to distinguish one component from another. For example, a first component may be referred to as a second component without departing from the scope of the present invention, and, likewise, a second component may be referred to as a first component. As used herein, the singular forms "a," "an," and "the" are intended to include the plural forms as well, unless the context clearly indicates otherwise.

In the present application, it is to be understood that the terms such as "including" or "having," etc., are intended to indicate the existence of the features, numbers, operations, actions, elements, parts, or combinations thereof disclosed in the specification, and are not intended to preclude the possibility that one or more other features, numbers, operations, actions, elements, parts, or combinations thereof may exist or may be added. It is to be understood that when an element is referred to as being "between" two elements, it may be the only element between the two elements, or one or more intervening elements may also be present. In addition, it is to be understood that when an element, such as a layer, a film, an area, or a substrate, is referred to as being "on" another element, it may be directly on the other element, or one or more intervening elements may also be present. Also, it is to be understood that when an element, such as a layer, a film, an area, or a substrate, is referred to as being "beneath" another element, it may be directly on or beneath the other element, or intervening elements may also be present.

Herein, some embodiments of the present invention will be described in further detail with reference to the accompanying drawings.

FIG. 1 is a perspective view illustrating a display device according to an embodiment of the present invention.

Figure 2:
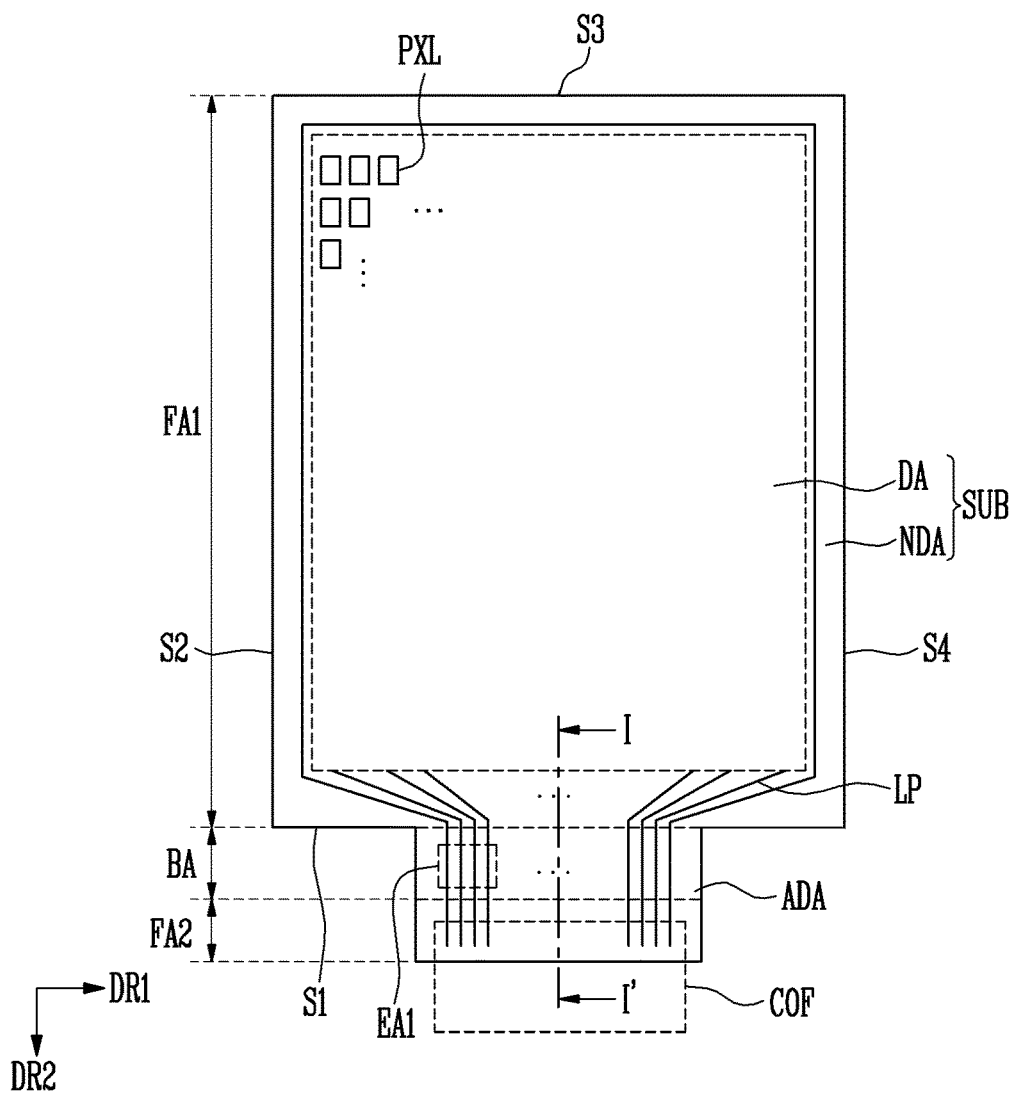
FIG. 2 is a plan view illustrating the display device of FIG. 1, shown in a state of not being bent.

Referring to FIGS. 1 and 2, a display device according to an embodiment of the present invention includes a substrate SUB, pixels PXL provided on the substrate SUB, and a wiring line unit including wiring lines LP connected to the pixels PXL.

The substrate SUB may include a display area DA and a non-display area DNA provided at least at one side of the display area DA.

The substrate SUB may be approximately rectangular (e.g., square). According to an embodiment of the present invention, the substrate SUB may include a pair of short sides that run parallel to each other in a first direction DR1 and a pair of long sides that run parallel to each other in a second direction DR2. According to the present embodiment, for the sake of convenience, the four sides of the substrate SUB that are sequentially connected, beginning with one of the pair of short sides, are referred to as first through fourth sides S1 through S4.

However, a shape of the substrate SUB is not limited thereto, and the substrate SUB may have any of various shapes. For example, the substrate SUB may be a closed polygon including straight sides, a circle or an ellipse including a curved side, or a semi-circle or a semi-ellipse including straight and curved sides. According to an embodiment of the present invention, when the substrate SUB has the straight sides, at least parts of edges of the respective shapes may be formed of curved lines. For example, when the substrate SUB is rectangular, each part at which adjacent straight sides meet may be replaced by a curved line having a curvature (e.g., a predetermined curvature). For example, each vertex of the rectangle may be formed of a curved side with a curvature (e.g., a predetermined curvature), in which both ends adjacent to each other are connected to two adjacent straight sides. The curvature may be set to vary in accordance with a position. For example, the curvature may vary in accordance with the position at which the curved line starts and a length of the curved line.

In the display area DA, the pixels PXL are provided, and an image may be displayed. The display area DA may have a shape corresponding to the shape of the substrate SUB. For example, the display area DA may be a closed polygon including straight sides, a circle or an ellipse including a curved side, or a semi-circle or a semi-ellipse including straight and curved sides, like the substrate SUB. According to an embodiment of the present invention, when the display area DA has the straight sides, at least parts of edges of the respective shapes may be formed of curved lines.

The pixels PXL are provided on the display area DA of the substrate SUB. The plurality of pixels PXL may be provided as units (e.g., minimum units) that display an image. The pixels PXL may emit white light components and/or color light components. Each of the pixels PXL may emit one of red light, green light, blue light, and white light. However, the present invention is not limited thereto. For example, the pixel PXL may emit one of cyan light, magenta light, and yellow light.

The pixels PXL may be emission elements including organic light emitting layers. However, the present invention is not limited thereto. The pixels PXL may be implemented by any of various elements, such as any of liquid crystal elements, electrophoretic elements, and electrowetting elements.

Figure 3:
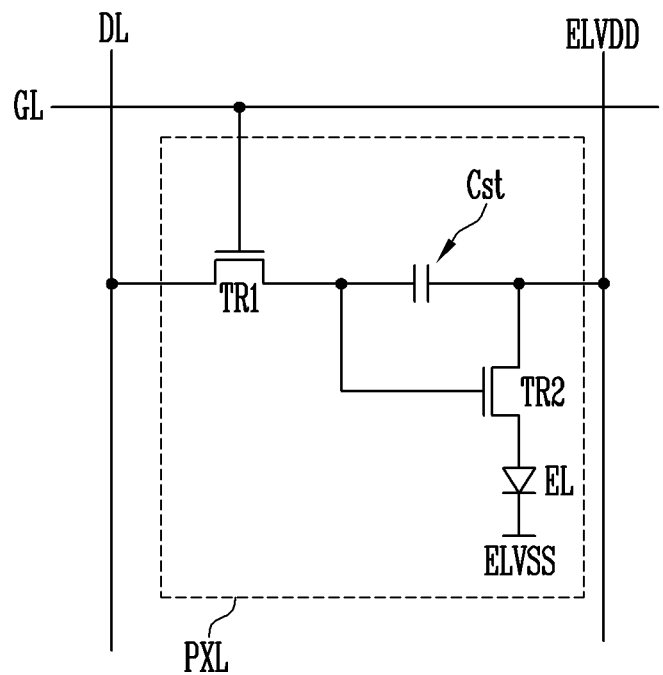
FIG. 3 is an equivalent circuit diagram illustrating that a pixel is an emission element according to an embodiment of the present invention.

FIG. 3 is an equivalent circuit diagram illustrating that a pixel is an emission element according to an embodiment of the present invention.

Referring to FIG. 3, each of the pixels (refer to "PXL" of FIG. 2) may include a thin film transistor (TFT) connected to the wiring lines (refer to "LP" of FIG. 2) of the wiring line unit, an emission element EL connected to the TFT, and a capacitor Cst.

The TFT may include a driving TFT TR2 for controlling the emission element EL and a switching TFT TR1 for switching the driving TFT TR2. According to an embodiment of the present invention, it is illustrated that one pixel PXL includes the two TFTs TR1 and TR2. However, the present invention is not limited thereto. For example, one pixel PXL may include one TFT and a capacitor or no less than three TFTs and no less than two capacitors. For example, one pixel PXL may include seven TFTs, an emission element, and a storage capacitor.

The switching TFT TR1 may include a gate electrode, a source electrode, and a drain electrode. In the switching TFT TR1, the gate electrode is connected to a gate wiring line GL and the source electrode may be connected to a data wiring line DL. The drain electrode may be connected to a gate electrode of the driving TFT TR2. The switching TFT TR1 may transmit a data signal applied to the data wiring line DL to the driving TFT TR2 in accordance with a scan signal applied to the gate wiring line GL.

The driving TFT TR2 may include a gate electrode, a source electrode, and a drain electrode. In the driving TFT TR2, the gate electrode is connected to the switching TFT TR1, the source electrode is connected to a first power source wiring line ELVDD, and the drain electrode may be connected to the emission element EL.

The emission element EL may include a light emitting layer and a first electrode and a second electrode that face each other with the light emitting layer interposed therebetween. The first electrode may be connected to the drain electrode of the driving TFT TR2. The second electrode is connected to a second power source wiring line ELVSS so that a common voltage may be applied to the second electrode of the emission element EL. The light emitting layer emits light or does not emit light in accordance with an output signal of the driving TFT TR2 and may display an image. Here, the light emitted from the light emitting layer may vary in accordance with a material of the light emitting layer and may be color light or white light.

The capacitor Cst is connected between the gate electrode and the source electrode of the driving TFT TR2 and may charge and maintain the data signal input to the gate electrode of the driving TFT TR2.

Referring to FIGS. 1 through 3, according to an embodiment of the present invention, the plurality of pixels PXL may be arranged in a row that extends in the first direction DR1 and in a column that extends in the second direction DR2. However, the arrangement of the pixels PXL is not limited thereto and the pixels PXL may be arranged in any of various forms. For example, the pixels PXL may be arranged in a row direction or in a direction oblique to the row direction.

In the non-display area NDA, the pixels PXL are not provided, and an image may not be displayed.

In the non-display area NDA, the wiring lines LP connected to the pixels PXL, and a driver (not shown) connected to the wiring lines LP to drive the pixels PXL may be provided.

The wiring lines LP may be connected to the pixels PXL. The wiring lines LP may provide signals to the pixels PXL. The wiring lines LP may be the gate wiring line GL, the data wiring line DL, the first power source wiring line ELVDD, and the second power source wiring line ELVSS.

The wiring lines LP may be provided in the display area DA and the non-display area NDA.

The wiring lines LP may be connected to the driver. The driver provides the signals to the pixels PXL through the wiring lines LP and may control driving of the pixels PXL.

The driver may include a scan driver (not shown) for providing scan signals to the pixels PXL along the gate wiring line GL, a data driver (not shown) for providing data signals to the pixels PXL along the data wiring line DL, and a timing controller (not shown) for controlling the scan driver and the data driver.

According to an embodiment of the present invention, the scan driver may be directly mounted on the substrate SUB.

When the scan driver is directly mounted on the substrate SUB, the scan driver may be formed in a process of forming the pixels PXL. However, a position of the scan driver and a method of forming the scan driver are not limited thereto. In an embodiment, the scan driver is formed in a separate chip and may be provided on the substrate SUB in the form of chip on glass or is mounted on the substrate SUB and may be connected to the substrate SUB through a connection member.

According to an embodiment of the present invention, the data driver may be directly mounted on the substrate SUB. However, the present invention is not limited thereto. In an embodiment, the data driver is formed in a separate chip and may be connected onto the substrate SUB. According to an embodiment of the present invention, when the data driver is formed in the separate chip and is connected onto the substrate SUB, the data driver may be provided in the form of chip on glass or chip on plastic or is mounted on the substrate SUB and may be connected to the substrate SUB through the connection member. According to an embodiment of the present invention, the data driver is in the form of a chip on film (COF) and may be connected to the substrate SUB.

According to an embodiment of the present invention, the non-display area NDA may further include an additional area ADA that protrudes from a part thereof. The additional area ADA may protrude from the sides that form the non-display area NDA. According to an embodiment of the present invention, the additional area ADA is illustrated as protruding from one of short sides of the substrate SUB. However, the additional area ADA may protrude from one of long sides or no less than two sides among the four sides. According to an embodiment of the present invention, the data driver may be provided in or connected to the additional area ADA. However, the present invention is not limited thereto, and any of various elements may be arranged in the additional area ADA.

According to an embodiment of the present invention, at least a part of the display device may be flexible and the flexible part may be folded or bent. That is, the display device may include a bent area BA having flexibility and folded or bent in a direction and a flat area that is provided at least at one side of the bent area BA and that is not folded and is flat. The flat area may have flexibility or may not have flexibility.

According to an embodiment of the present invention, the bent area BA is illustrated as being provided in the additional area ADA. According to an embodiment of the present invention, a first flat area FA1 and a second flat area FA2 separate from each other with the bent area BA interposed therebetween may be provided, and the first flat area FA1 may include the display area DA. According to an embodiment of the present invention, the bent area BA may be separate from the display area DA.

In the bent area BA, when a line on which the display device is folded is referred to as a fold line, the fold line may be provided in the bent area BA. Here, the term "folded" means that the display device is not fixed to one form but may be transformed from one to another. The display device may be folded, curved, or rolled along no less than one specific line, that is, the fold line. According to an embodiment of the present invention, it is illustrated that the display device is folded such that the surfaces of the two flat areas FA1 and FA2 are positioned to run parallel with each other and face each other. However, the present invention is not limited thereto. The display device may be folded such that the surfaces of the two flat areas FA1 and FA2 form an angle (e.g., a predetermined angle, for example, an acute angle, a right angle, or an obtuse angle) with the bent area BA interposed therebetween.

According to an embodiment of the present invention, the additional area ADA may be bent along the fold line. In this case, since the additional area ADA is bent, a width of a bezel may be reduced.

Figure 4:
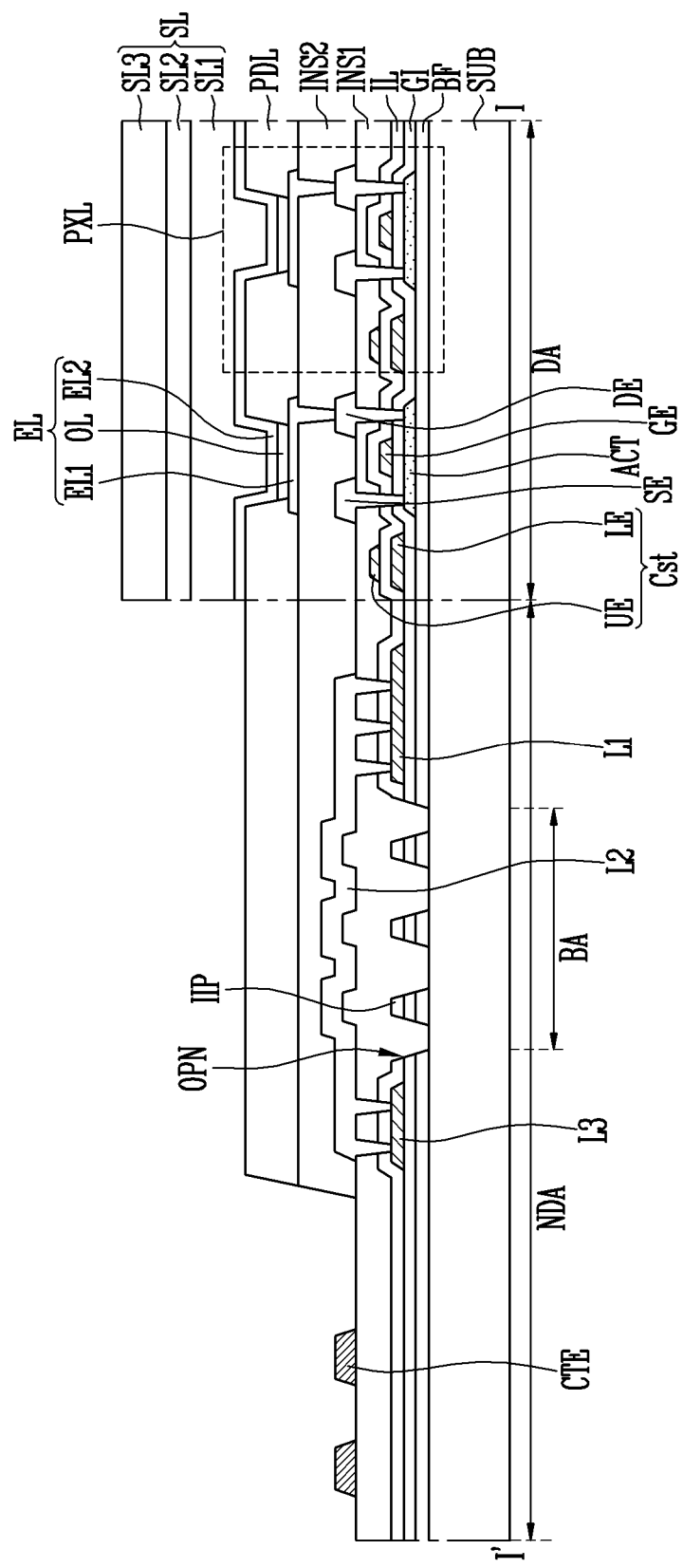
FIG. 4 is a cross-sectional view taken along the line I-I' of FIG. 2.

FIG. 4 is a cross-sectional view taken along the line I-I' of FIG. 2 and illustrates some pixels of the display area and the non-display area. FIG. 4 conceptually illustrates a display device according to an embodiment of the present invention. For the sake of convenience, some elements may be exaggerated or contracted.

A part of the display device according to an embodiment of the present invention is bent as illustrated in FIG. 1. However, in FIG. 4, for the sake of convenience, the display device is illustrated as not being bent. For reference, in cross-sectional views or plan views according to embodiments herein, for the sake of convenience, the display device is illustrated as not being bent.

Hereinafter, referring to FIGS. 1 through 4, the display device according to an embodiment of the present invention will be described in further detail.

First, the display area DA will be described. Then, the non-display area NDA will be described.

According to an embodiment of the present invention, the plurality of pixels PXL may be provided in the display area DA. Each of the pixels PXL includes a transistor connected to a corresponding wiring line LP among the wiring lines LP, the emission element EL connected to the transistor, and the capacitor Cst. The transistor may include the driving transistor TR2 for controlling the emission element EL and the switching transistor TR1 for switching the driving transistor TR2.

In FIG. 3, for the sake of convenience, it is illustrated that one pixel PXL includes two transistors and one capacitor. However, the present invention is not limited thereto. One pixel PXL may include no less than two transistors and at least one capacitor or no less than three transistors and no less than two capacitors.

The pixels PXL according to an embodiment of the present invention may be provided on the substrate SUB.

The substrate SUB may include an insulating material such as glass or resin. In addition, the substrate SUB may include a flexible material so as to be curved or folded and may have a single layer structure or a multilayer structure.

For example, the substrate SUB may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material that forms the substrate SUB may be any of various materials and may include fiber reinforced plastic (FRP).

A buffer layer BF may be provided on the substrate SUB. The buffer layer BF may prevent or substantially prevent impurities from being diffused into the switching and driving transistors. The buffer layer BF may be provided as a single layer or a multilayer formed of no less than two layers.

The buffer layer BF may be an inorganic insulating layer including an inorganic material. For example, the buffer layer BF may be formed of a silicon nitride, a silicon oxide, or a silicon oxynitride. When the buffer layer BF is provided as the multilayer, the respective layers may be formed of the same material or different materials. The buffer layer BF may be omitted in accordance with a material and a process condition of the substrate SUB.

An active pattern ACT may be provided on the buffer layer BF. The active pattern ACT may be formed of a semiconductor material. The active pattern ACT may include a source area, a drain area, and a channel area provided between the source area and the drain area. The active pattern ACT may be a semiconductor pattern formed of polysilicon, amorphous silicon, and oxide semiconductor. The channel area as a semiconductor pattern that is not doped with impurities may be intrinsic semiconductor. The source area and the drain area may be semiconductor patterns doped with impurities. The impurities may be n-type impurities, p-type impurities, or other metals.

A gate insulating layer GI may be provided on the buffer layer BF provided with the active pattern ACT. The gate insulating layer GI may be an inorganic insulating layer including an inorganic material or an organic insulating layer including an organic material. The inorganic material may be an inorganic insulating material, such as polysiloxane, a silicon nitride, a silicon oxide, or a silicon oxynitride. The organic material may be an organic insulating material, such as a polyacryl based compound, a polyimide based compound, a fluorine based carbon compound such as Teflon, or a benzocyclobutene compound.

A gate electrode GE and a capacitor lower electrode LE may be provided on the gate insulating layer GI. The gate electrode GE may cover an area corresponding to the channel area of the active pattern ACT.

The gate electrode GE and the capacitor lower electrode LE may be formed of metal. For example, the gate electrode GE may be formed of at least one among gold (Au), silver (Ag), aluminum (Al), molybdenum (Mo), chromium (Cr), titanium (Ti), nickel (Ni), neodymium (Nd), and copper (Cu), or an alloy of the above metals. In addition, the gate electrode GE may be formed of a single layer. However, the present invention is not limited thereto. The gate electrode GE may be formed of a multilayer obtained by stacking no less than two materials among the above metals and alloys.

According to an embodiment of the present invention, although not shown, other wiring lines including gate wiring lines may be formed of the same material in the same layer as the gate electrode GE and the capacitor lower electrode LE. Here, the other wiring lines such as the gate wiring lines may be directly or indirectly connected to a part of a transistor in each of the pixels PXL.

An interlayer insulating layer IL may be provided on the gate insulating layer GI on which the gate electrode GE and the capacitor lower electrode LE are provided. The interlayer insulating layer IL may be an inorganic insulating layer including an inorganic material. The inorganic material may be polysiloxane, a silicon nitride, a silicon oxide, or a silicon oxynitride.

A capacitor upper electrode UE may be provided on the interlayer insulating layer IL. The capacitor upper electrode UE may be formed of metal. For example, the capacitor upper electrode UE may be formed of at least one among Au, Ag, Al, Mo, Cr, Ti, Ni, Nd, and Cu, or an alloy of the above metals. In addition, the capacitor upper electrode UE may be formed of a single layer. However, the present invention is not limited thereto. The capacitor upper electrode UE may be formed of a multilayer obtained by stacking no less than two materials among the above metals and alloys.

The capacitor lower electrode LE and the capacitor upper electrode UE may form the capacitor Cst with the interlayer insulating layer IL interposed therebetween. According to an embodiment of the present invention, it is illustrated that the capacitor Cst is formed of the capacitor lower electrode LE and the capacitor upper electrode UE. However, the present invention is not limited thereto. The capacitor Cst may be implemented by any of various methods.

A first insulating layer INS1 may be provided on the interlayer insulating layer IL on which the capacitor upper electrode UE is provided. The first insulating layer INS1 may be an organic insulating layer including an organic insulating material, such as a polyacryl based compound, a polyimide based compound, a fluorine based carbon compound such as Teflon, or a benzocyclobutene compound.

A source electrode SE and a drain electrode DE may be provided on the first insulating layer INS1. The source electrode SE and the drain electrode DE may respectively contact a source area and a drain area of the active pattern ACT through contact holes formed in the first insulating layer INS1, the interlayer insulating layer IL, and the gate insulating layer GI.

The source electrode SE and the drain electrode DE may be formed of metal. For example, the source electrode SE and the drain electrode DE may be formed of at least one among Au, Ag, Al, Mo, Cr, Ti, Ni, Nd, and Cu, or an alloy of the above metals. In addition, the source electrode SE and the drain electrode DE may be formed of a single layer. However, the present invention is not limited thereto. The source electrode SE and the drain electrode DE may be formed of a multilayer obtained by stacking no less than two materials among the above metals and alloys.

According to an embodiment of the present invention, although not shown, data wiring lines or first power source wiring lines may be formed of the same material in the same layer as the source electrode SE and the drain electrode DE. Here, the data wiring lines or the first power source wiring lines may be directly or indirectly connected to a part, for example, the source electrode SE and/or the drain electrode DE of a transistor in each of the pixels PXL.

A second insulating layer INS2 may be provided on the first insulating layer INS1 on which the source electrode SE and the drain electrode DE are provided. That is, the second insulating layer INS2 may cover the transistor.

The second insulating layer INS2 may be an organic insulating layer including an organic insulating material, such as a polyacryl based compound, a polyimide based compound, a fluorine based carbon compound such as Teflon, or a benzocyclobutene compound.

The emission element EL may be provided on the second insulating layer INS2. The emission element EL may include a first electrode EL1, an organic light emitting layer OL, and a second electrode EL2.

The first electrode EL1 may be provided on the second insulating layer INS2. The first electrode EL1 may be connected to the drain electrode DE through a contact hole that passes through the second insulating layer INS2.

A pixel defining layer PDL that partitions off an emission area to correspond to each of the pixels PXL may be provided on the second insulating layer INS2 on which the first electrode EL1 is provided. The pixel defining layer PDL exposes an upper surface of the first electrode EL1 and may protrude from the second insulating layer INS2 along a circumference of the pixel PXL.

The organic light emitting layer OL is provided on the first electrode EL1 exposed by the pixel defining layer PDL, and the second electrode EL2 may be provided on the organic light emitting layer OL.

One of the first electrode EL1 and the second electrode EL2 may be an anode electrode, and the other of the first electrode EL1 and the second electrode EL2 may be a cathode electrode. For example, the first electrode EL1 may be the anode electrode, and the second electrode EL2 may be the cathode electrode.

In addition, at least one of the first electrode EL1 and the second electrode EL2 may be a transmissive electrode. For example, when the emission element EL is a rear surface emission type emission element, the first electrode EL1 is a transmissive electrode and the second electrode EL2 may be a reflective electrode. When the emission element EL is a front surface emission type emission element, the first electrode EL1 is the reflective electrode and the second electrode EL2 may be the transmissive electrode. When the emission element EL is a both side emission type emission element, both the first electrode EL1 and the second electrode EL2 may be transmissive electrodes. According to the present embodiment, it is illustrated that the emission element EL is the front surface emission type emission element and the first electrode EL1 is the anode electrode.

The first electrode EL1 may include a reflecting layer (not shown) capable of reflecting light and a transparent conductive layer (not shown) arranged on or under the reflecting layer. At least one of the transparent conductive layer and the reflecting layer may be connected to the drain electrode DE.

The reflecting layer may include a material capable of reflecting light. For example, the reflecting layer may include at least one among Al, Ag, Cr, Mo, platinum (Pt), Ni, and an alloy of the above metals.

The transparent conductive layer may include a transparent conductive oxide. For example, the transparent conductive layer may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one among polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The organic light emitting layer OL may be arranged on the exposed surface of the first electrode EL1. The organic light emitting layer OL may have a multilayer thin film structure including at least a light generation layer LGL. For example, the organic light emitting layer OL may include a hole injection layer HIL for injecting holes, a hole transport layer HTL with high transportability of holes for preventing or substantially preventing electrons that are not combined in the light generation layer LGL from moving and increasing recombination probability of holes and electrons, the light generation layer LGL for emitting light by recombination of the injected electrons and holes, a hole blocking layer HBL for preventing or substantially preventing holes that are not combined in the light generation layer LGL from moving, an electron transport layer ETL for smoothly transporting electrons to the light generation layer LGL, and an electron injection layer EIL for injecting electrons. Here, the hole injection layer HIL, the hole transport layer HTL, the hole blocking layer HBL, the electron transport layer ETL, and the electron injection layer EIL may be common layers commonly arranged in adjacent pixels PXL.

The light generation layer LGL may include a low or high molecular material. The low molecular material may include copper phthalocyanine, N,N'-Di(naphthalene-1-yl)-N,N'-diphenyl-benzidine (NPB), or tris-8-hydroxyquinoline aluminum (Alq3). The above materials may be formed by vacuum deposition. The high molecular material may be PEDOT, poly-phenylenevinylene (PPV) based material, or polyfluorine based material.

A color of light generated by the light generation layer LGL may be one of red, green, blue, and white. However, the present invention is not limited thereto. For example, a color of light generated by the light generation layer LGL may be one of magenta, cyan, and yellow.

The second electrode EL2 may be a semi-transmissive reflecting layer. For example, the second electrode EL2 may be a thin metal layer having a thickness at which the light emitted from the organic light emitting layer OL may be transmitted. The second electrode EL2 transmits a part of the light emitted from the organic light emitting layer OL and may reflect the remaining light emitted from the organic light emitting layer OL.

The second electrode EL2 may include a material with a lower work function than the transparent conductive layer. For example, the second electrode EL2 may include at least one among Mo, tungsten (W), Ag, magnesium (Mg), Al, Pt, palladium (Pd), Au, Ni, Nd, iridium (Ir), Cr, Ca, and an alloy of the above metals.

A part of the light emitted from the organic light emitting layer OL does not pass through the second electrode EL2 and the light reflected from the second electrode EL2 may be reflected again from a reflecting layer. That is, the light emitted from the organic light emitting layer OL may resonate between the reflecting layer and the second electrode EL2. Light extraction efficiency of the organic emission element EL may improve due to the resonance of the light.

A distance between the reflecting layer and the second electrode EL2 may vary in accordance with the color of the light emitted from the organic light emitting layer OL. That is, the distance between the reflecting layer and the second electrode EL2 may be controlled to be suitable for a resonance distance in accordance with the color of the light emitted from the organic light emitting layer OL.

An encapsulation layer SL may be provided on the second electrode EL2. The encapsulation layer SL may be formed of a single layer or a multilayer. According to an embodiment of the present invention, the encapsulation layer SL may be formed of first through third encapsulation layers SL1 through SL3. The first through third encapsulation layers SL1 through SL3 may include an organic material and/or an inorganic material. The third encapsulation layer SL3 positioned at the outermost part may include an inorganic material.

According to an embodiment of the present invention, the first encapsulation layer SL1 may include an inorganic material, the second encapsulation layer SL2 may include an organic material or an inorganic material, and the third encapsulation layer SL3 may include an inorganic material. The inorganic material is less vulnerable to moisture or oxygen than the organic material. However, since the inorganic material has small elasticity or flexibility, the inorganic material may be vulnerable to cracking. It is possible to prevent a crack from expanding by forming the first encapsulation layer SL1 and the third encapsulation layer SL3 of the inorganic material and by forming the second encapsulation layer SL2 of the organic material. Here, when the second encapsulation layer SL2 includes the organic material, an end of the second encapsulation layer SL2 may be completely covered with the third encapsulation layer SL3 so as not to be exposed to the outside.

According to an embodiment of the present invention, the organic material may be an organic insulating material such as a polyacryl based compound, a polyimide based compound, a fluorine based carbon compound such as Teflon, or a benzocyclobutene compound. The inorganic material may be polysiloxane, a silicon nitride, a silicon oxide, or a silicon oxynitride. When the second encapsulation layer SL2 includes the inorganic material instead of the organic material, one of various silicon based insulating materials, such as hexamethyldisiloxane (HMDSO), octamethylcyclo-tetrasiloxane (OMCTSO), tetramethyldisiloxane (TMDSO), and tetraethyleorthosilicate (TEOS) may be used as the second encapsulation layer SL2. According to an embodiment of the present invention, the organic light emitting layer OL that forms the emission element EL may be easily damaged by external moisture or oxygen. The encapsulation layer SL may protect the organic light emitting layer OL by covering the organic light emitting layer OL. The encapsulation layer SL covers the display area DA and may extend to the outside of the display area DA.

Next, the non-display area NDA will be described. Herein, in describing the non-display area NDA, description of previously described elements may not be repeated.

According to an embodiment of the present invention, the wiring lines LP are provided in the non-display area NDA, and the bent area BA in which the substrate SUB is folded may be provided in the non-display area NDA.

The wiring lines LP may connect the driver and the pixels PXL. The wiring lines LP may include gate wiring lines, data wiring lines, and power source wiring lines. According to an embodiment of the present invention, the data wiring lines may be included in the wiring lines LP. However, the gate wiring lines or the power source wiring lines may also be included in the wiring lines LP.

The wiring lines LP according to an embodiment of the present invention may respectively connect the pixels PXL and the driver and may extend from the pixels PXL approximately in a second direction DR2. The wiring lines LP may extend to an end of the additional area ADA in the second direction DR2 and contact electrodes CTE may be provided at the end of the additional area ADA. The pixels PXL may be connected to the driver implemented in the form of COF through the contact electrodes CTE connected to the wiring lines LP.

Each of the wiring lines LP may include first through third connection wiring lines L1 through L3. The first connection wiring line L1 and the second connection wiring line L2 may be connected one to one, and the second connection wiring line L2 and the third connection wiring line L3 may be connected one to one. In FIG. 4, for the sake of convenience, only parts of the first through third connection wiring lines L1 through L3 are schematically illustrated.

The buffer layer BF may be provided on the non-display area NDA of the substrate SUB.

The gate insulating layer GI may be provided on the buffer layer BF.

The first connection wiring line L1 and the third connection wiring line L3 may be provided on the gate insulating layer GI. The first connection wiring line L1 is provided in the first flat area FA1, and the third connection wiring line L3 may be provided in the second flat area FA2. In an embodiment, the first connection wiring line L1 and the third connection wiring line L3 may be formed of the same material in the same process as the gate electrode GE.

The interlayer insulating layer IL may be provided on the first connection wiring line L1 and the third connection wiring line L3.

Areas of the buffer layer BF, the gate insulating layer GI, and the interlayer insulating layer IL, which correspond to the bent area BA, may be removed. That is, the buffer layer BF, the gate insulating layer GI, and the interlayer insulating layer IL may have openings OPN that expose the substrate SUB in the areas corresponding to the bent area BA.

According to an embodiment, in parts of the buffer layer BF, the gate insulating layer GI, and the interlayer insulating layer IL, the areas corresponding to the bent area BA may not be removed. For example, in the buffer layer BF, the area corresponding to the bent area BA may not be removed and, in the remaining insulating layers, that is, the gate insulating layer GI and the interlayer insulating layer IL, the areas corresponding to the bent area BA are removed and openings may be formed.

That the openings correspond to the bent area BA means that the openings overlap the bent area BA. An area of the opening may be larger than an area of the bent area BA. According to an embodiment of the present invention, for the sake of convenience, it is illustrated that a width of the opening is equal to a width of the bent area BA. However, the width of the opening may be larger than the width of the bent area BA.

For reference, in FIG. 4, it is illustrated that internal surfaces of the buffer layer BF, the gate insulating layer GI, and the interlayer insulating layer IL coincide with each other and are arranged on a straight line. However, the present invention is not limited thereto. For example, an area of the opening of the buffer layer BF may be larger than an area of the openings of the gate insulating layer GI and the interlayer insulating layer IL. According to an embodiment of the present invention, the area of the opening of the buffer layer BF may be smaller than an area of the opening of the gate insulating layer GI and an area of the opening of the interlayer insulating layer IL.

Figure 6:
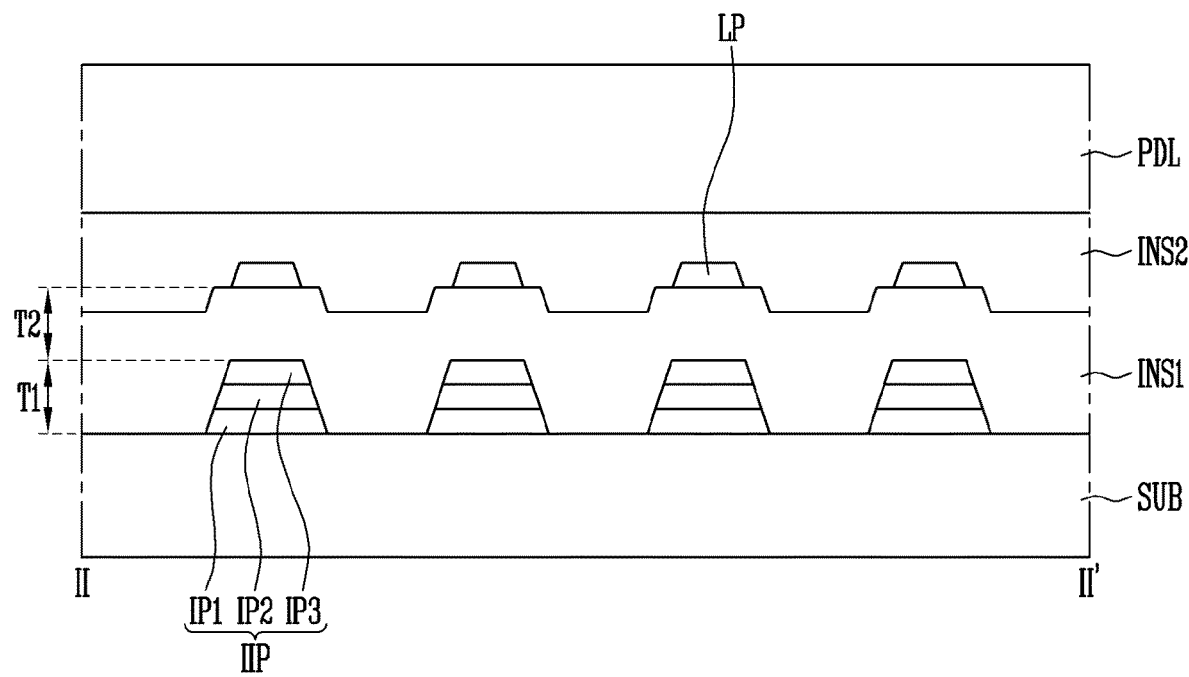
FIG. 6 is a cross-sectional view taken along the line II-II' of FIG. 5.
Figure 7:
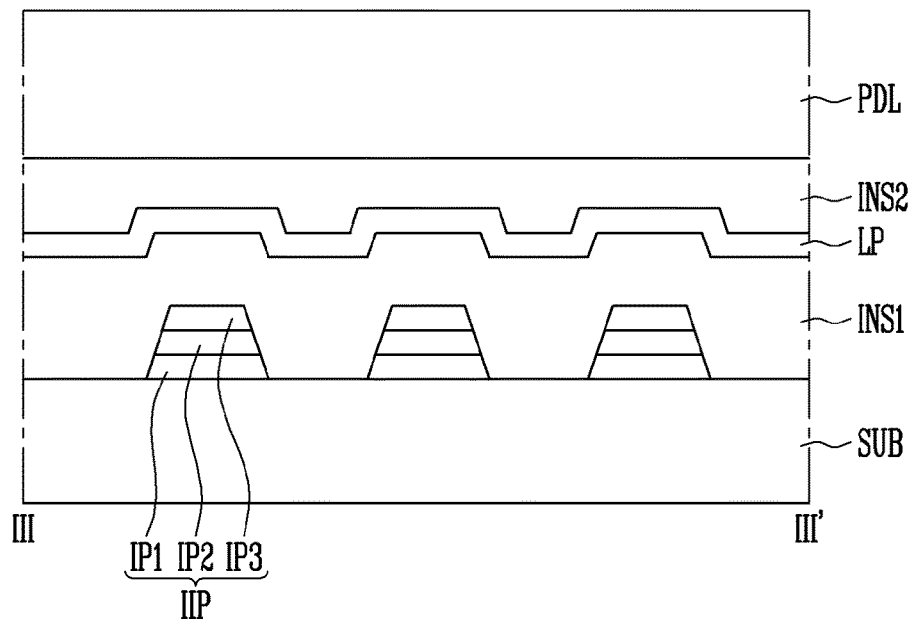
FIG. 7 is a cross-sectional view taken along the line III-III' of FIG. 5.

A plurality of inorganic insulating patterns IIP may be provided on the substrate SUB in the bent area BA. The inorganic insulating patterns IIP may be island-shaped. The inorganic insulating patterns IIP may include sequentially stacked no less than two inorganic insulating layers. For example, the inorganic insulating patterns IIP may include a first inorganic insulating layer IP1 provided on the substrate SUB, a second inorganic insulating layer IP2 provided on the first inorganic insulating layer IP1, and a third inorganic insulating layer IP3 provided on the second inorganic insulating layer IP2, as shown in FIGS. 6 and 7. The first inorganic insulating layer IP1 may include the same material as the buffer layer BF. The second inorganic insulating layer IP2 may include the same material as the gate insulating layer GI. The third inorganic insulating layer IP3 may include the same material as the interlayer insulating layer IL. The inorganic insulating patterns IIP may be arranged to be separate from each other.

The first insulating layer INS1 may be provided on the substrate SUB on which the interlayer insulating layer IL and the inorganic insulating patterns IIP are provided. That is, the first insulating layer INS1 extends from the first flat area FA1 to the bent area BA and may fill the opening. In addition, a surface of the first insulating layer INS1 may include a concavo-convex part due to the inorganic insulating patterns IIP.

The second connection wiring line L2 may be provided on the first insulating layer INS1. In addition, the contact electrodes CTE may be provided on the first insulating layer INS1. In an embodiment, the second connection wiring line L2 and the contact electrodes CTE may be formed of the same material in the same process as the source electrode SE and the drain electrode DE. The second connection wiring line L2 may extend from the first flat area FA1 to the second flat area FA2 through the bent area BA. The second connection wiring line L2 may be connected to the first connection wiring line L1 and the third connection wiring line L3 through contact holes that pass through the interlayer insulating layer IL and the first insulating layer INS1.

In addition, the second connection wiring line L2 may have a concavo-convex part due to the concavo-convex surface of the first insulating layer INS1. That is, the second connection wiring line L2 is convex in areas corresponding to the inorganic insulating patterns IIP and may be concave in areas separate or spaced from the inorganic insulating patterns IIP.

As described above, in FIG. 4, it is illustrated that the display device is not curved. However, the display device according to an embodiment of the present invention may be bent in the bent area BA. The display device according to an embodiment of the present invention is manufactured to be flat and may be bent after being manufactured.

According to an embodiment of the present invention, for the sake of convenience, it is illustrated that the bent area BA coincides with a part from which inorganic insulating layers are removed. However, the bent area BA and the part from which the inorganic insulating layers are removed may not coincide with each other. For example, the bent area BA approximately corresponds to the parts from which the inorganic insulating layers are removed. However, as occasion demands, the bent area BA may be wider or narrower than the part from which the inorganic insulating layers are removed. In addition, according to an embodiment of the present invention, it is illustrated that the bent area BA is positioned only in the non-display area NDA. However, the present invention is not limited thereto. For example, the bent area BA may be provided over the non-display area NDA and the display area DA or in the display area DA.

The second insulating layer INS2 may be provided on the first insulating layer INS1 on which the second connection wiring line L2 is provided. The second insulating layer INS2 may be an organic insulating layer including an organic material. The organic material may be an organic insulating material, such as a polyacryl based compound, a polyimide based compound, a fluorine based carbon compound such as Teflon, or a benzocyclobutene compound.

The pixel defining layer PDL of the display area DA may be arranged to extend on the second insulating layer INS2. Here, the second insulating layer INS2 and the pixel defining layer PDL may not cover and expose the contact electrodes CTE.

Figure 5:
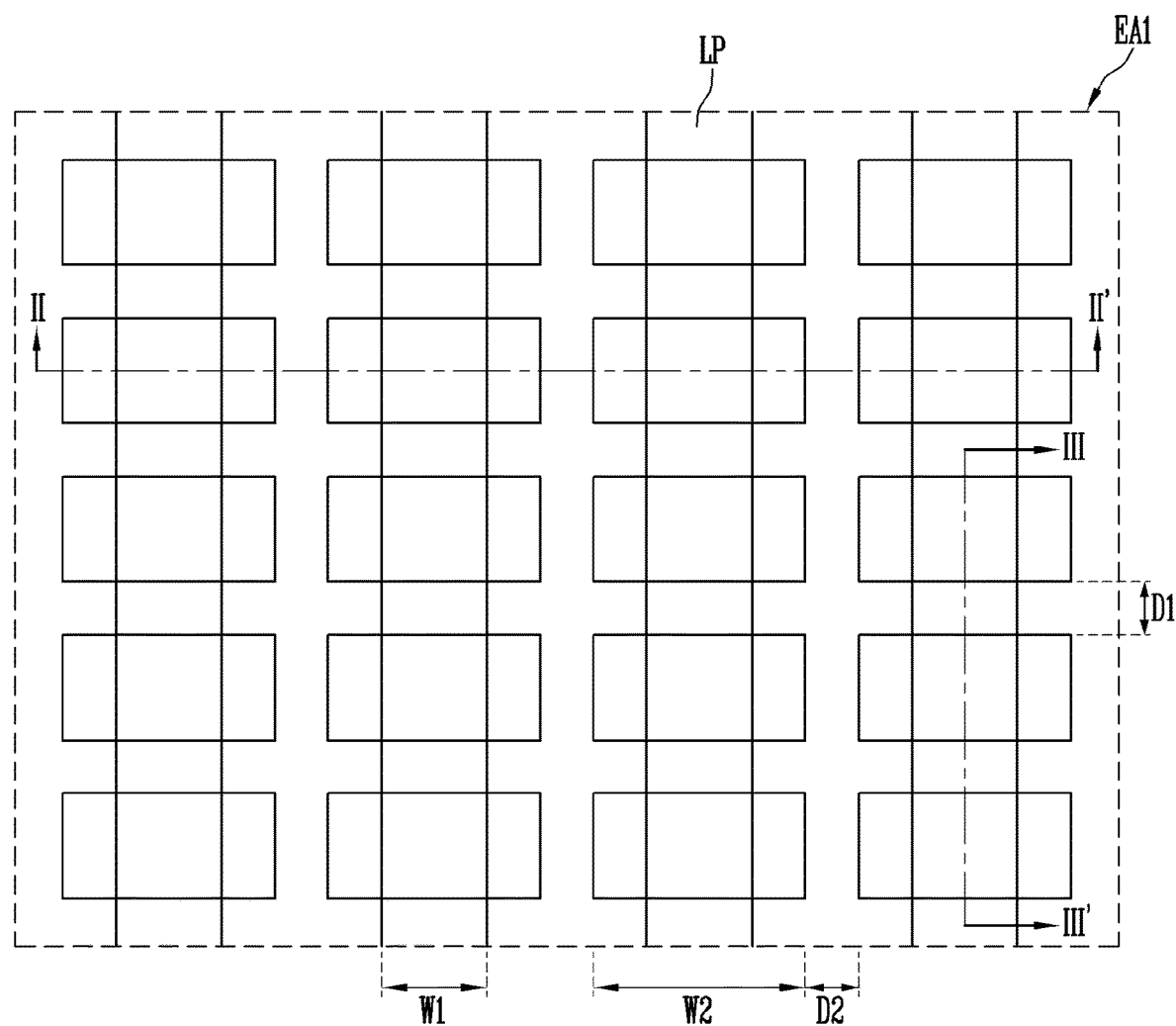
FIG. 5 is an enlarged view of a region "EA1" of FIG. 2.

FIG. 5 is an enlarged view of a region "EA1" of FIG. 2; FIG. 6 is a cross-sectional view taken along the line II-II' of FIG. 5; and FIG. 7 is a cross-sectional view taken along the line III-III' of FIG. 5.

Referring to FIGS. 1 through 5 and 7, in the bent area BA, the display device may include the substrate SUB, the plurality of inorganic insulating patterns IIP provided on the substrate SUB and separate from each other, the first insulating layer INS1 provided on the substrate SUB on which the inorganic insulating patterns IIP are provided, the wiring lines LP provided on the first insulating layer INS1, and the second insulating layer INS2 provided on the first insulating layer INS1 on which the wiring lines LP are provided.

The inorganic insulating patterns IIP may be island-shaped. The inorganic insulating patterns IIP may be arranged in a matrix. However, the present invention is not limited thereto. The inorganic insulating patterns IIP may be arranged in any of various forms.

The inorganic insulating patterns IIP may include sequentially stacked no less than two inorganic insulating layers. For example, the inorganic insulating patterns IIP may include the first inorganic insulating layer IP1 provided on the substrate SUB, the second inorganic insulating layer IP2 provided on the first inorganic insulating layer IP1, and the third inorganic insulating layer IP3 provided on the second inorganic insulating layer IP2. Each of the first inorganic insulating layer IP1, the second inorganic insulating layer IP2, and the third inorganic insulating layer IP3 may include the same material as one of the buffer layer BF, the gate insulating layer GI, and the interlayer insulating layer IL. For example, the first inorganic insulating layer IP1 may include the same material as the buffer layer BF. The second inorganic insulating layer IP2 may include the same material as the gate insulating layer GI. The third inorganic insulating layer IP3 may include the same material as the interlayer insulating layer IL.

The first insulating layer INS1 may cover the inorganic insulating patterns IIP. The first insulating layer INS1 may be an organic insulating layer including an organic material. In addition, the surface of the first insulating layer INS1 may include the concavo-convex part due to the inorganic insulating patterns IIP.

The wiring lines LP may include the concave-convex part due to the concavo-convex surface of the first insulating layer INS1. That is, the wiring lines LP are convex in the areas corresponding to the inorganic insulating patterns IIP and may be concave in the areas separate or spaced from the inorganic insulating patterns IIP.

According to the present embodiment, in a direction in which the wiring lines LP extend and in a direction vertical to the direction in which the wiring lines LP extend, each of the inorganic insulating patterns IIP may overlap one wiring line LP.

In an embodiment, since the first insulating layer INS1 includes the organic insulating material, the concavo-convex part generated by a step difference of a lower structure may be removed and the first insulating layer INS1 may be planarized. According to the present embodiment, in order for the inorganic insulating patterns IIP to form the concavo-convex part on the surface of the first insulating layer INS1, a thickness and a width of the inorganic insulating patterns IIP may be limited and a distance between adjacent inorganic insulating patterns IIP may be limited. In addition, a thickness of the first insulating layer INS1 and a width of the wiring lines LP may be limited.

For example, in the direction vertical to the direction in which the wiring lines LP extend, a first width W1 of the wiring lines LP may be no more than a second width W2 of the inorganic insulating patterns IIP. In an embodiment, in the direction in which the wiring lines LP extend, a first distance D1 between adjacent inorganic insulating patterns IIP may be no more than 50% of the sum of the first width W1 and the second width W2. In an embodiment, in the direction vertical to the direction in which the wiring lines LP extend, a second distance D2 between adjacent inorganic insulating patterns IIP may be equal to the first distance D1. In an embodiment, a thickness T2 of the first insulating layer INS1 may be no more than 1.5 times a thickness T1 of the inorganic insulating patterns IIP. In an embodiment, the thickness T1 of the inorganic insulating patterns IIP may be no less than 10% of the sum of the first width W1 and the second width W2. In an embodiment, the thickness T1 of the inorganic insulating patterns IIP may be no less than 8,000 Å.

When the thickness and width of the inorganic insulating patterns IIP, the distance between the adjacent inorganic insulating patterns IIP, the thickness of the first insulating layer INS1, and the width of the wiring lines LP deviate from the above described ranges, the concavo-convex part may not be formed on the surface of the first insulating layer INS1.

The wiring lines LP may include the concavo-convex part due to the concavo-convex surface of the first insulating layer INS1. When the wiring lines LP include the concavo-convex part, a contact area between the first insulating layer INS1 and the wiring lines LP increases and a length of the wiring lines LP may increase. The wiring lines LP may include a material having malleability and ductility. Therefore, when the contact area between the first insulating layer INS1 and the wiring lines LP increases and a length of the wiring lines LP increases, it is possible to prevent the wiring lines LP from being broken when the display device is bent. In addition, since it is possible to prevent the wiring lines LP from being broken when the display device is bent, it is possible to improve reliability of the display device.

Herein, display devices according to other embodiments of the present invention will be described with reference to FIGS. 8 through 17. In FIGS. 8 through 17, same elements as the elements of FIGS. 1 through 7 are denoted by the same reference numerals and description thereof may be omitted. In addition, in order not to give repeated description, in FIGS. 8 through 17, elements different from the elements of FIGS. 1 through 7 will be mainly described.

Figure 8:
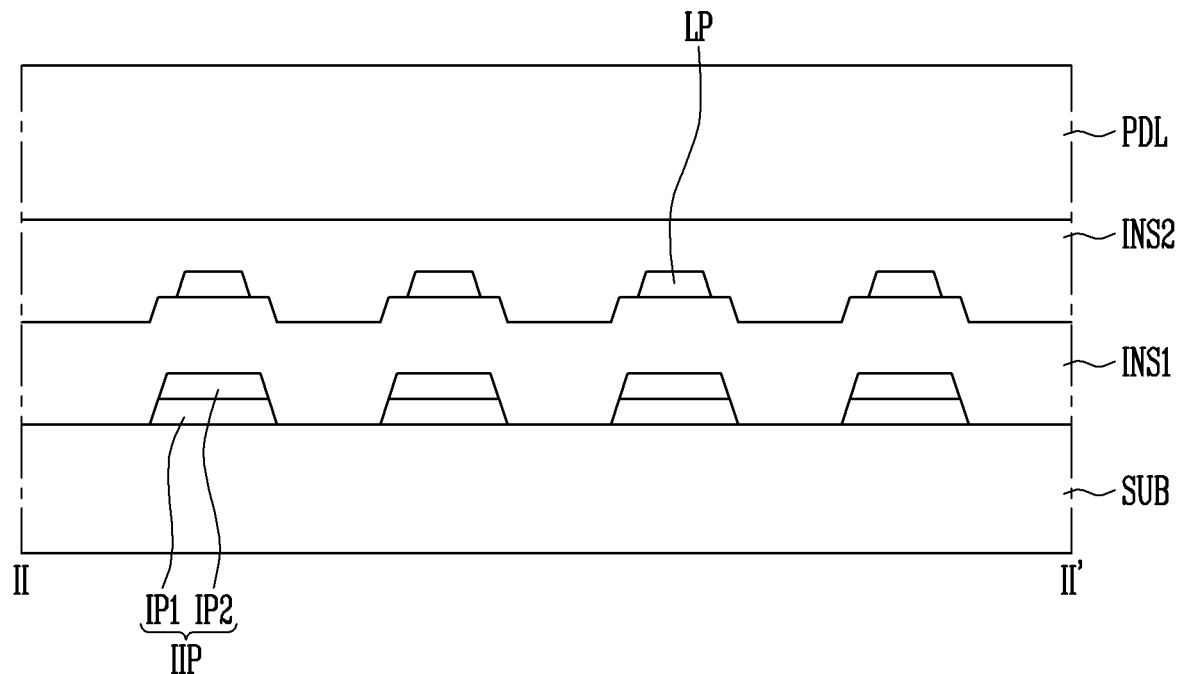
FIGS. 8 and 9 are cross-sectional views illustrating a display device according to another embodiment of the present invention, taken along lines corresponding to the lines II-II' and III-III' of FIG. 5, respectively.
Figure 9:
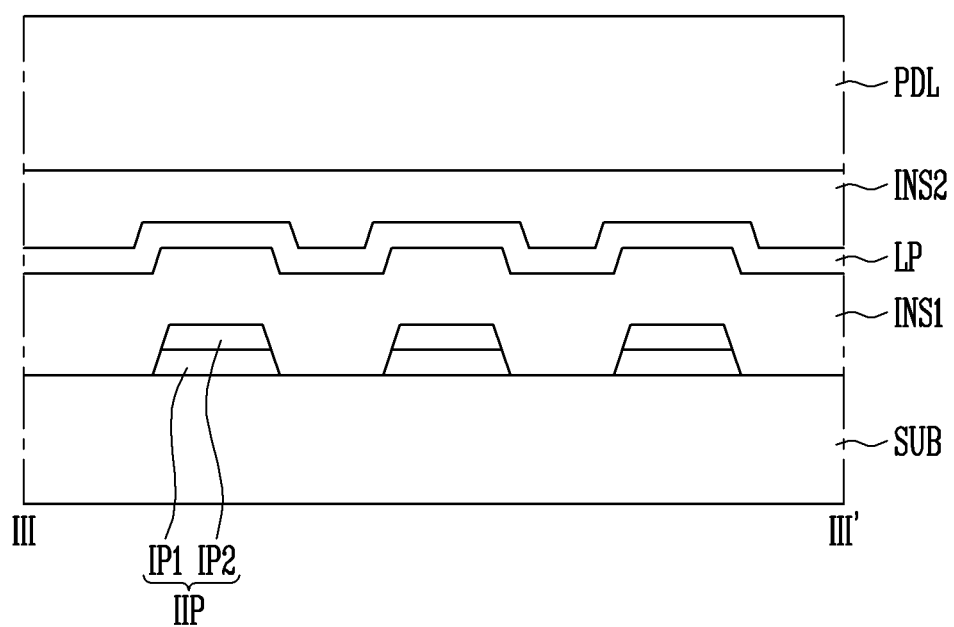

FIGS. 8 and 9 are views illustrating a display device according to another embodiment of the present invention. FIG. 8 is a cross-sectional view taken along a line corresponding to the line II-II' of FIG. 5; and FIG. 9 is a cross-sectional view taken along a line corresponding to the line III-III' of FIG. 5.

Referring to FIGS. 1 through 5, 8, and 9, in the bent area BA, the display device may include the substrate SUB, the plurality of inorganic insulating patterns IIP provided on the substrate SUB and separate from each other, the first insulating layer INS1 provided on the substrate SUB on which the inorganic insulating patterns IIP are provided, the wiring lines LP provided on the first insulating layer INS1, and the second insulating layer INS2 provided on the first insulating layer INS1 on which the wiring lines LP are provided.

The inorganic insulating patterns IIP may be arranged in a matrix. The inorganic insulating patterns IIP may include sequentially stacked no less than two inorganic insulating layers. For example, the inorganic insulating patterns IIP may include the first inorganic insulating layer IP1 provided on the substrate SUB and the second inorganic insulating layer IP2 provided on the first inorganic insulating layer IP1. Each of the first inorganic insulating layer IP1 and the second inorganic insulating layer IP2 may include the same material as one of the buffer layer BF, the gate insulating layer GI, and the interlayer insulating layer IL. For example, the first inorganic insulating layer IP1 may include the same material as the buffer layer BF. The second inorganic insulating layer IP2 may include the same material as one of the gate insulating layer GI and the interlayer insulating layer IL, for example, the same material as the interlayer insulating layer IL.

The first insulating layer INS1 may cover the inorganic insulating patterns IIP. The first insulating layer INS1 may be an organic insulating layer including an organic material. In addition, the surface of the first insulating layer INS1 may include the concavo-convex part due to the inorganic insulating patterns IIP.

The wiring lines LP may be provided on the first insulating layer INS1. The wiring lines LP may include the concave-convex part due to the concavo-convex surface of the first insulating layer INS1. When the wiring lines LP include the concave-convex part, the contact area between the first insulating layer INS1 and the wiring lines LP increases and the length of the wiring lines LP may increase. Therefore, it is possible to prevent the wiring lines LP from being broken when the display device is bent and to improve reliability of the display device.

Figure 10:
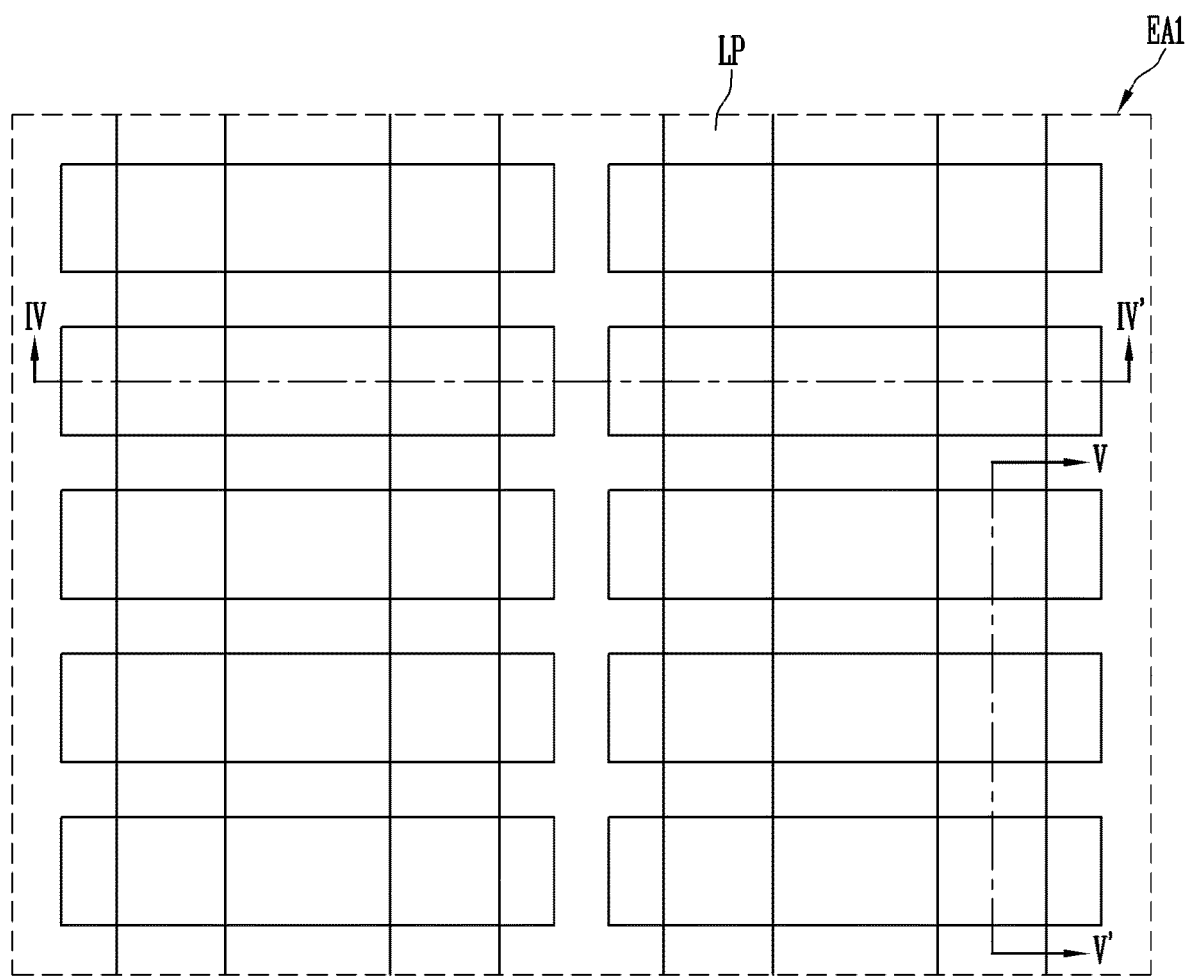
FIGS. 10 through 12 are views illustrating a display device according to another embodiment of the present invention.
Figure 11:
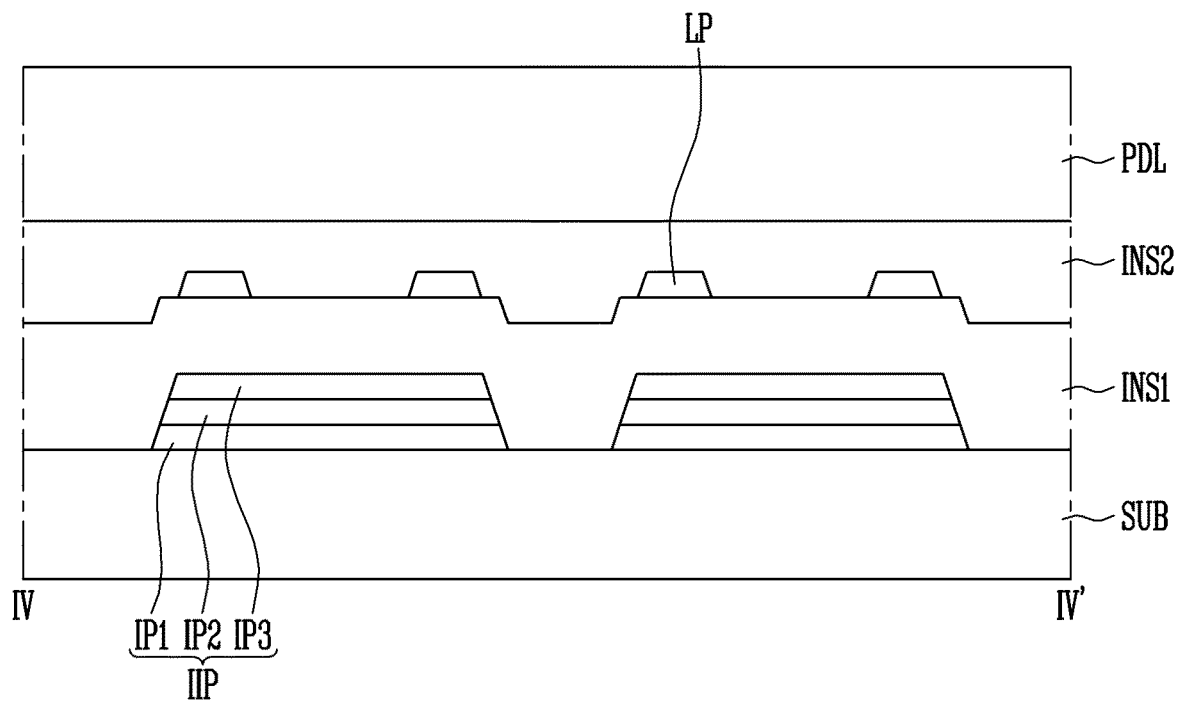
Figure 12:
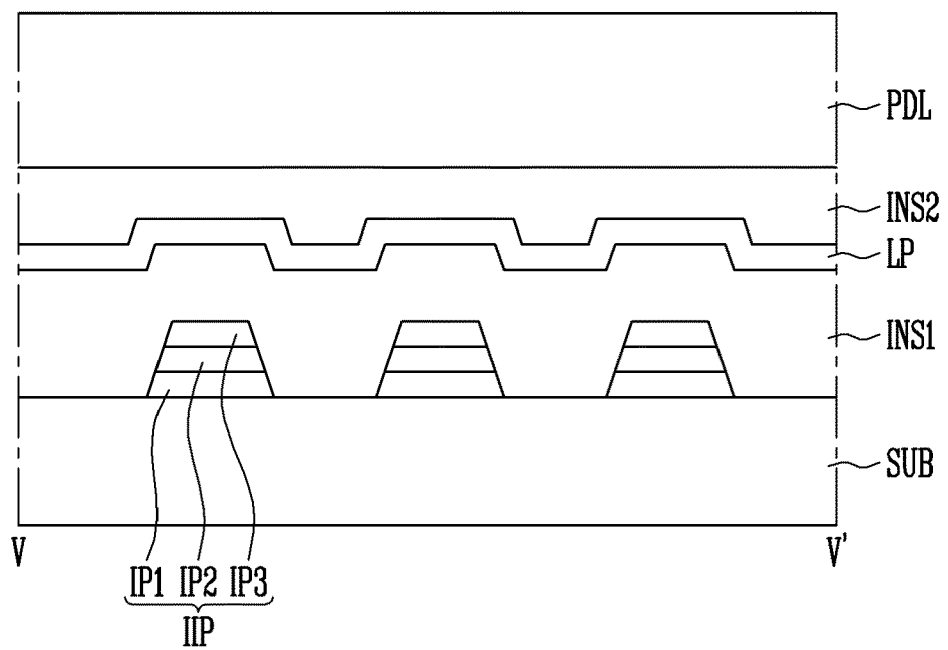

FIGS. 10 through 12 are views illustrating a display device according to another embodiment of the present invention. FIG. 10 is an enlarged view of a region corresponding to the region EA1 of FIG. 2. FIG. 11 is a cross-sectional view taken along the line IV-IV' of FIG. 10; and FIG. 12 is a cross-sectional view taken along the line V-V' of FIG. 10.

Referring to FIGS. 1 through 4 and 10 through 12, in the bent area BA, the inorganic insulating patterns IIP may be provided on the substrate SUB. The inorganic insulating patterns IIP may be arranged in a matrix.

The inorganic insulating patterns IIP may include sequentially stacked no less than two inorganic insulating layers. For example, the inorganic insulating patterns IIP may include the first inorganic insulating layer IP1 provided on the substrate SUB and the second inorganic insulating layer IP2 provided on the first inorganic insulating layer IP1. Each of the first inorganic insulating layer IP1 and the second inorganic insulating layer IP2 may include the same material as one of the buffer layer BF, the gate insulating layer GI, and the interlayer insulating layer IL. For example, the first inorganic insulating layer IP1 may include the same material as the buffer layer BF. The second inorganic insulating layer IP2 may include the same material as the gate insulating layer GI or the interlayer insulating layer IL. In an embodiment, the second inorganic insulating layer IP2 may include the same material as the gate insulating layer GI, and the inorganic insulating patterns IIP may further include the third inorganic insulating layer IP3 provided on the second inorganic insulating layer IP2, and the third inorganic insulating layer IP3 may include the same material as the interlayer insulating layer IL.

The first insulating layer INS1 may be provided on the substrate SUB on which the inorganic insulating patterns IIP are provided. The first insulating layer INS1 may cover the inorganic insulating patterns IIP. In addition, due to the inorganic insulating patterns IIP, the surface of the first insulating layer INS1 may include the concavo-convex part.

The wiring lines LP may be provided on the first insulating layer INS1. The wiring lines LP may include the concave-convex part due to the concavo-convex surface of the first insulating layer INS1. That is, the wiring lines LP are convex in the areas corresponding to the inorganic insulating patterns IIP and are concave in the areas separate or spaced from the inorganic insulating patterns IIP.

When the wiring lines LP include the concave-convex part, the contact area between the first insulating layer INS1 and the wiring lines LP increases and the length of the wiring lines LP may increase. Therefore, it is possible to prevent the wiring lines LP from being broken when the display device is bent and to improve reliability of the display device.

According to the present embodiment, in the bent area BA, the plurality of inorganic insulating patterns IIP may be provided on the substrate SUB. The inorganic insulating patterns IIP may be island-shaped. The inorganic insulating patterns IIP may be arranged in a matrix. However, the present invention is not limited thereto. The inorganic insulating patterns IIP may be arranged in any of various forms.

According to the present embodiment, in the direction in which the wiring lines LP extend, each of the inorganic insulating patterns IIP may overlap one wiring line LP. In addition, in the direction vertical to the direction in which the wiring lines LP extend, each of the inorganic insulating patterns IIP may overlap a plurality of wiring lines LP. For example, in the direction vertical to the direction in which the wiring lines LP extend, each of the inorganic insulating patterns IIP may overlap two wiring lines LP.

Figure 13:
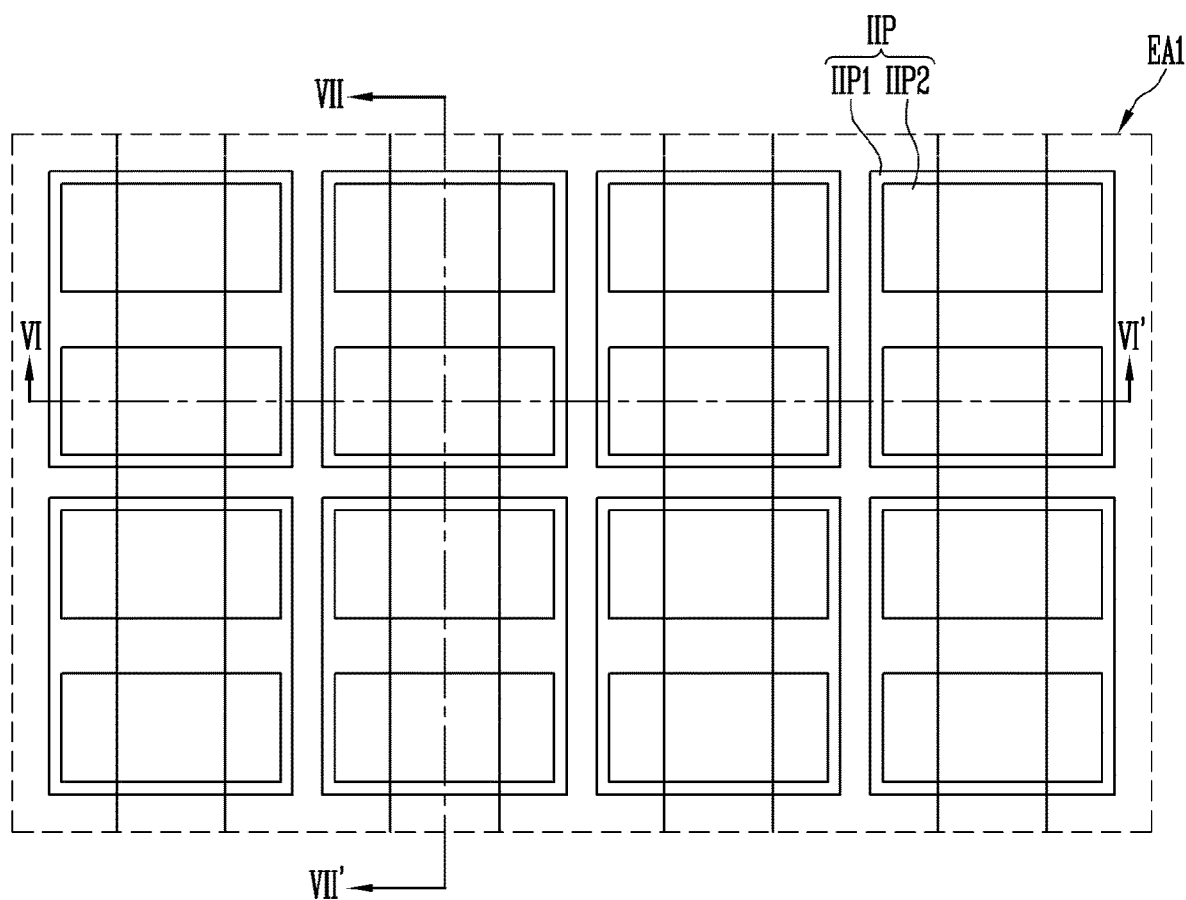
FIGS. 13 through 15 are views illustrating a display device according to another embodiment of the present invention.
Figure 14:
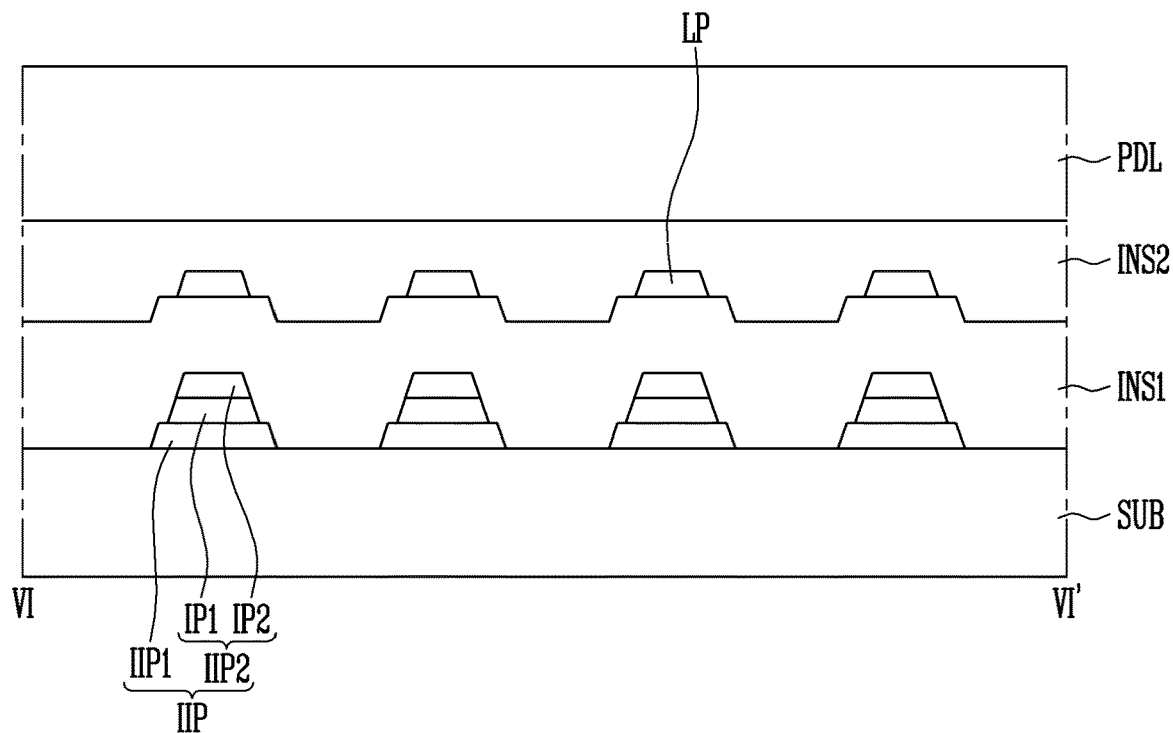
Figure 15:
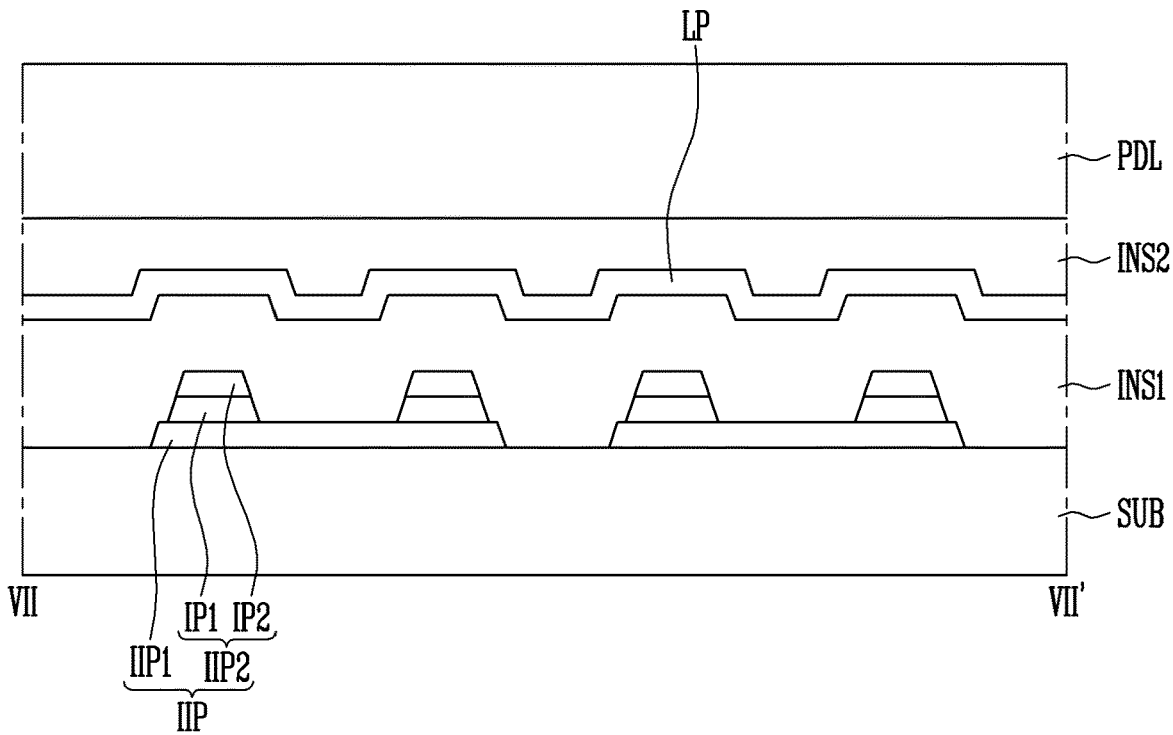

FIGS. 13 through 15 are views illustrating a display device according to another embodiment of the present invention.

FIG. 13 is an enlarged view of a region corresponding to the region EA1 of FIG. 2. FIG. 14 is a cross-sectional view taken along the line VI-VI' of FIG. 13; and FIG. 15 is a cross-sectional view taken along the line VII-VII' of FIG. 13.

Referring to FIGS. 1 through 4 and 13 through 15, in the bent area BA, the display device may include the substrate SUB, the plurality of inorganic insulating patterns IIP provided on the substrate SUB and separate from each other, the first insulating layer INS1 provided on the substrate SUB on which the inorganic insulating patterns IIP are provided, the wiring lines LP provided on the first insulating layer INS1, and the second insulating layer INS2 provided on the first insulating layer INS1 on which the wiring lines LP are provided.

The inorganic insulating patterns IIP may be island-shaped. The inorganic insulating patterns IIP may include a first inorganic insulating layer IIP1 provided on the substrate SUB and at least one second inorganic insulating layer IIP2 provided on the first inorganic insulating layer IIP1.

In the direction in which the wiring lines LP extend and in the direction vertical to the direction in which the wiring lines LP extend, the first inorganic insulating pattern IIP1 may overlap one wiring line LP. The first inorganic insulating pattern IIP1 may include the same material as the buffer layer BF. An area of the first inorganic insulating pattern IIP1 may be larger than an area of the second inorganic insulating pattern IIP2. For example, the area of the first inorganic insulating pattern IIP1 may be twice the area of the second inorganic insulating pattern IIP2. Therefore, the no less than two second inorganic insulating patterns IIP2 may be arranged on the first inorganic insulating pattern IIP1.

In the direction in which the wiring lines LP extend, the second inorganic insulating patterns IIP2 may be arranged to be separate from each other. The second inorganic insulating patterns IIP2 may include sequentially stacked no less than two inorganic insulating layers. For example, the second inorganic insulating patterns IIP2 may include the first inorganic insulating layer IP1 provided on the substrate SUB and the second inorganic insulating layer IP2 provided on the first inorganic insulating layer IP1. Each of the first inorganic insulating layer IP1 and the second inorganic insulating layer IP2 may include the same material as one of the gate insulating layer GI and the interlayer insulating layer IL. For example, the first inorganic insulating layer IP1 may include the same material as the gate insulating layer GI. The second inorganic insulating layer IP2 may include the same material as the interlayer insulating layer IL.

The first insulating layer INS1 may cover the inorganic insulating patterns IIP. The first insulating layer INS1 may be an organic insulating layer including an organic material. In addition, the surface of the first insulating layer INS1 may include the concavo-convex part due to the inorganic insulating patterns IIP.

The wiring lines LP may be provided on the first insulating layer INS1. The wiring lines LP may include the concave-convex part due to the concave-convex surface of the first insulating layer INS1. When the wiring lines LP include the concave-convex part, the contact area between the first insulating layer INS1 and the wiring lines LP increases and the length of the wiring lines LP may increase. Therefore, it is possible to prevent the wiring lines LP from being broken when the display device is bent and to improve reliability of the display device.

Figure 16:
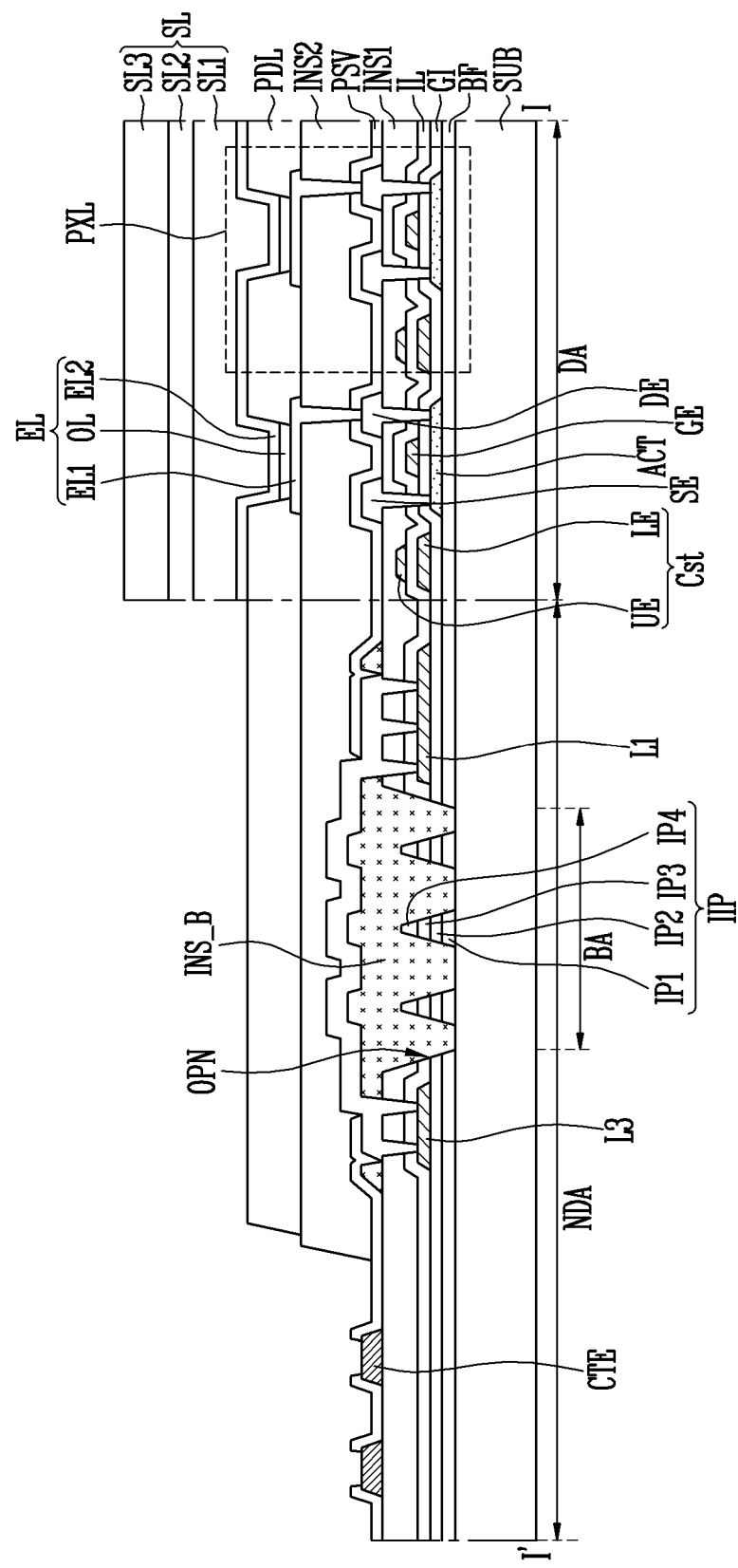
FIGS. 16 and 17 are cross-sectional views illustrating a display device according to other embodiments of the present invention, taken along a line corresponding to the line I-I' of FIG. 2.
Figure 17:
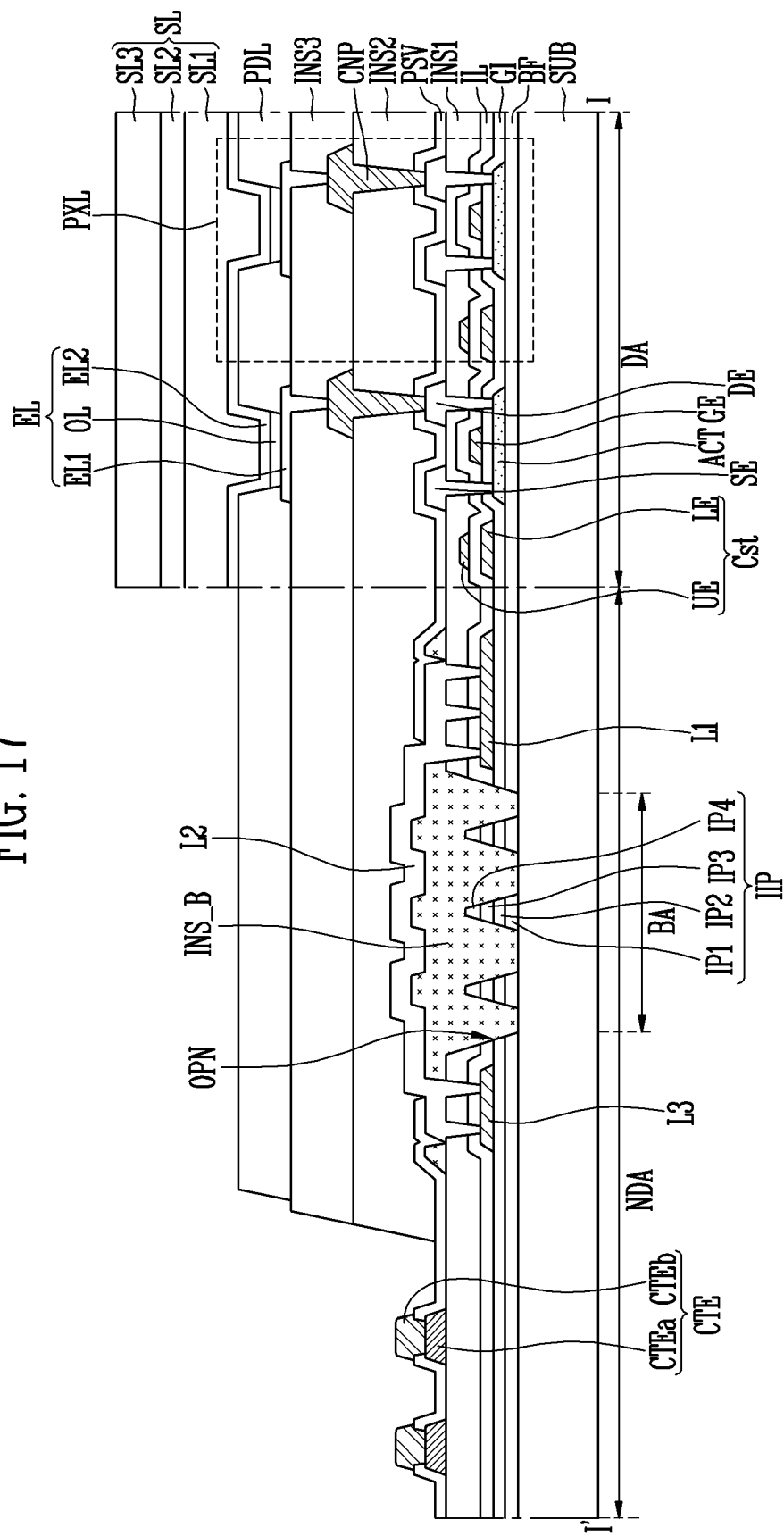

FIGS. 16 and 17 are views illustrating a display device according to another embodiment of the present invention.

Referring to FIGS. 1 through 3, 16, and 17, the display device may include the display area DA and the non-display area NDA.

Herein, the display area DA will be first described and, then, the non-display area NDA will be described.

The plurality of pixels PXL may be provided in the display area DA. Each of the pixels PXL includes a transistor connected to a corresponding wiring line LP among the wiring lines LP, the emission element EL connected to the transistor, and the capacitor Cst. The transistor may include the driving transistor TR2 for controlling the emission element EL and the switching transistor TR1 for switching the driving transistor TR2.

The pixels PXL may be provided on the substrate SUB. Herein, a stack structure of the pixels PXL will be described.

The buffer layer BF may be provided on the substrate SUB. The buffer layer BF may prevent or substantially prevent impurities from being diffused into the switching and driving transistors TR1 and TR2.

The active pattern ACT may be provided on the buffer layer BF.

The gate insulating layer GI may be provided on the buffer layer BF on which the active pattern ACT is provided.

The gate electrode GE and the capacitor lower electrode LE may be provided on the gate insulating layer GI.

The interlayer insulating layer IL may be provided on the gate insulating layer GI on which the gate electrode GE and the capacitor lower electrode LE are provided.

The capacitor upper electrode UE may be provided on the interlayer insulating layer IL.

The first insulating layer INS1 may be provided on the interlayer insulating layer IL on which the capacitor upper electrode UE is provided.

According to the present embodiment, the buffer layer BF, the gate insulating layer GI, the interlayer insulating layer IL, and the first insulating layer INS1 may be inorganic insulating layers including inorganic materials.

The source electrode SE and the drain electrode DE may be provided on the first insulating layer INS1. The source electrode SE and the drain electrode DE may respectively contact the source area and the drain area of the active pattern ACT through the contact holes formed in the first insulating layer INS1, the interlayer insulating layer IL, and the gate insulating layer GI.

The protective layer PSV may be provided on the first insulating layer INS1 on which the source electrode SE and the drain electrode DE are provided. The protective layer PSV may be an inorganic insulating layer including an inorganic material. The inorganic material may be polysiloxane, a silicon nitride, a silicon oxide, or a silicon oxynitride. The protective layer PSV may be omitted according to an embodiment.

The second insulating layer INS2 may be provided on the protective layer PSV. The second insulating layer INS2 may be an organic insulating layer including an organic material.

The emission element EL may be provided on the second insulating layer INS2. The emission element EL may include the first electrode EL1, the organic light emitting layer OL, and the second electrode EL2.

The first electrode EL1 may be provided on the second insulating layer INS2. The first electrode EL1 may be connected to the drain electrode DE through the contact hole that passes through the second insulating layer INS2.

The pixel defining layer PDL for partitioning off the emission area to correspond to each of the pixels PXL may be provided on the second insulating layer INS2 on which the first electrode EL1 is provided. The pixel defining layer PDL exposes the upper surface of the first electrode EL1 and may protrude from the second insulating layer INS2 along the circumference of the pixel PXL.

The organic light emitting layer OL is provided on the first electrode EL1 exposed by the pixel defining layer PDL, and the second electrode EL2 may be provided on the organic light emitting layer OL.

One of the first electrode EL1 and the second electrode EL2 may be the anode electrode, and the other of the first electrode EL1 and the second electrode EL2 may be the cathode electrode. For example, the first electrode EL1 may be the anode electrode, and the second electrode EL2 may be the cathode electrode.

According to an embodiment, as illustrated in FIG. 17, the third insulating layer INS3 may be provided between the second insulating layer INS2 and the emission element EL. The third insulating layer INS3 may be an organic insulating layer including an organic material. The organic material may be an organic insulating material, such as a polyacryl based compound, a polyimide based compound, a fluorine based carbon compound such as Teflon, or a benzocyclobutene compound.

The first electrode EL1 of the emission element EL is provided on the third insulating layer INS3 and may be electrically connected to the drain electrode DE through a connection pattern CNP provided on the second insulating layer INS2. The connection pattern CNP may be connected to the drain electrode DE through the contact holes that pass through the second insulating layer INS2 and the protective layer PSV. The connection pattern CPN may be formed of at least one among Au, Ag, Al, Mo, Cr, Ti, Ni, Nd, and Cu, or an alloy of the above metals. In addition, the connection pattern CNP may be formed of a single layer. However, the present invention is not limited thereto. The connection pattern CNP may be formed of a multilayer obtained by stacking no less than two materials among the metals and alloy.

In addition, the first electrode EL1 may be connected to the connection pattern CNP through the contact hole that passes through the third insulating layer INS3. Therefore, the first electrode EL1 may be electrically connected to the drain electrode DE through the connection pattern CNP.

The encapsulation layer SL may be provided on the second electrode EL2. The encapsulation layer SL may be formed of a single layer or a multilayer. According to an embodiment of the present invention, the encapsulation layer SL may be formed of the first through third encapsulation layers SL1 through SL3. The first through third encapsulation layers SL1 through SL3 may include an organic material and/or an inorganic material. The third encapsulation layer SL3 positioned at the outermost part may include an inorganic material.

Next, the non-display area NDA will be described. In describing the non-display area NDA, in order not to give repeated description, description of the previously described elements may not be repeated.

According to an embodiment of the present invention, the wiring lines LP are provided in the non-display area NDA and the bent area BA in which the substrate SUB is folded may be provided in the non-display area NDA.

The wiring lines LP may connect the driver and the pixels PXL. For this purpose, the wiring lines LP may extend approximately in the second direction DR2.

The wiring lines LP may extend to the end of the additional area ADA in the second direction DR2 and contact electrodes CTE may be provided at the end of the additional area ADA. The pixels PXL may be connected to the driver implemented in the form of COF through the contact electrodes CTE connected to the wiring lines LP.

Each of the wiring lines LP may include the first through third connection wiring lines L1 through L3. The first connection wiring line L1 and the second connection wiring line L2 may be connected one to one, and the second connection wiring line L2 and the third connection wiring line L3 may be connected one to one.

The buffer layer BF may be provided on the non-display area NDA of the substrate SUB.

The gate insulating layer GI may be provided on the buffer layer BF.

The first connection wiring line L1 and the third connection wiring line L3 may be provided on the gate insulating layer GI. The first connection wiring line L1 is provided in the first flat area FA1, and the third connection wiring line L3 may be provided in the second flat area FA2.

The interlayer insulating layer IL may be provided on the first connection wiring line L1 and the third connection wiring line L3.

The first insulating layer INS1 may be provided on the interlayer insulating layer IL.

Areas of the buffer layer BF, the gate insulating layer GI, the interlayer insulating layer IL, and the first insulating layer INS1, which correspond to the bent area BA, may be removed. That is, the buffer layer BF, the gate insulating layer GI, the interlayer insulating layer IL, and the first insulating layer INS1 may have openings that expose the substrate SUB in the areas corresponding to the bent area BA.

The plurality of inorganic insulating patterns IIP may be provided on the substrate SUB in the bent area BA. The inorganic insulating patterns IIP may be island-shaped. The inorganic insulating patterns IIP may be arranged to be separate from each other.

The inorganic insulating patterns IIP may include sequentially stacked no less than two inorganic insulating layers. For example, the inorganic insulating patterns IIP may include the first inorganic insulating layer IP1 provided on the substrate SUB, the second inorganic insulating layer IP2 provided on the first inorganic insulating layer IP1, the third inorganic insulating layer IP3 provided on the second inorganic insulating layer IP2, and a fourth inorganic insulating layer IP4 provided on the third inorganic insulating layer IP3. The first inorganic insulating layer IP1 may include the same material as the buffer layer BF. The second inorganic insulating layer IP2 may include the same material as the gate insulating layer GI. The third inorganic insulating layer IP3 may include the same materials as the interlayer insulating layer IL. The fourth inorganic insulating layer IP4 may include the same material as the first insulating layer INS1.

A fill insulating layer INS_B may be provided in the opening. The fill insulating layer INS_B fills at least a part of the opening and may concurrently or simultaneously cover an area adjacent to the opening, for example, a part of a top of the first insulating layer INS1 corresponding to the first and/or second flat areas FA1 and/or FA2. The fill insulating layer INS_B may be an organic insulating layer including an organic material. The organic material may be an organic insulating material, such as a polyacryl based compound, a polyimide based compound, a fluorine based carbon compound such as Teflon, or a benzocyclobutene compound.

The fill insulating layer INS_B may cover the inorganic insulating patterns IIP. In addition, a surface of the fill insulating layer INS_B may include a concavo-convex part due to the inorganic insulating patterns IIP.

The second connection wiring line L2 may be provided on the fill insulating layer INS_B and the first insulating layer INS1. In addition, the contact electrodes CTE may be provided on the first insulating layer INS1. In an embodiment, the second connection wiring line L2 and the contact electrodes CTE may be formed of the same material in the same process as the source electrode SE and the drain electrode DE.

The second connection wiring line L2 may extend from the first flat area FA1 to the second flat area FA2 through the bent area BA. In the first flat area FA1 and the second flat area FA2, the second connection wiring line L2 may be connected to the first connection wiring line L1 and the third connection wiring line L3 through the contact holes that pass through the interlayer insulating layer IL and the first insulating layer INS1.

In addition, the second connection wiring line L2 may have the concavo-convex part due to the concavo-convex surface of the fill insulating layer INS_B. That is, the second connection wiring line L2 may be convex in the areas corresponding to the inorganic insulating patterns IIP and may be concave in the areas separate or spaced from the inorganic insulating patterns IIP.

When the wiring lines LP include the concave-convex part, a contact area between the fill insulating layer INS_B and the wiring lines LP increases and the length of the wiring lines LP may increase. Therefore, it is possible to prevent the wiring lines LP from being broken when the display device is bent and to improve reliability of the display device.

The second insulating layer INS2 may be provided on the first insulating layer INS1 and the fill insulating layer INS_B on which the second connection wiring line L2 is provided. The second insulating layer INS2 may be an organic insulating layer including an organic material.

The pixel defining layer PDL of the display area DA may be arranged to extend on the second insulating layer INS2. Here, the second insulating layer INS2 and the pixel defining layer PDL may not cover and expose the contact electrodes CTE.

According to an embodiment, as illustrated in FIG. 17, the third insulating layer INS3 may be provided between the second insulating layer INS2 and the pixel defining layer PDL. The third insulating layer INS3 may be an organic insulating layer including an organic material. The organic material may be an organic insulating material, such as a polyacryl based compound, a polyimide based compound, a fluorine based carbon compound such as Teflon, or a benzocyclobutene compound.

When the third insulating layer INS3 is provided between the second insulating layer INS2 and the pixel defining layer PDL, the contact electrode CTE may include a lower contact electrode CTEa provided on the first insulating layer INS1 and an upper contact electrode CTEb provided on the lower contact electrode CTEa.

In an embodiment, the lower contact electrode CTEa may be formed of the same material in the same process as the second connection wiring line L2 and the source electrode SE and the drain electrode DE. The upper contact electrode CTEb may be formed of the same material in the same process as the second connection wiring line L2.

Some example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present invention as set forth in the following claims.

What is claimed is:

1. A display device comprising:
   a substrate including a bent area wherein the entirety of the bent area is bent;
   inorganic insulating patterns arranged over an upper surface of the substrate in the bent area, the inorganic insulating patterns being spaced apart from each other along a first direction with openings between the inorganic insulating patterns along the first direction;
   wiring lines arranged over the inorganic insulating patterns and the openings so as to overlap the inorganic insulating patterns and the openings in a second direction perpendicular to each of the first direction and the upper surface of the substrate, in the bent area;
   a first organic insulating layer on the wiring lines, in the bent area; and
   a second organic insulating layer on the first organic insulating layer, in the bent area, the first organic insulating layer being in contact with the second organic insulating layer and located between the wiring lines and the second organic insulating layer.

2. The display device of claim 1, wherein a thickness of the second organic insulating layer is greater than a thickness of the first organic insulating layer.

3. The display device of claim 1, wherein a concavo-convex surface of the first organic insulating layer is between the wiring lines and the second organic insulating layer.

4. The display device of claim 1, further comprising a plurality of pixels,
   wherein each of the plurality of pixels comprises a transistor on the substrate and an emission element connected to the transistor, and
   wherein the first organic insulating layer is on a source electrode and a drain electrode of the transistor.

5. The display device of claim 4,
   wherein the transistor comprises:
   a buffer layer on the substrate;
   an active pattern on the buffer layer;
   a gate insulating layer on the active pattern;
   a gate electrode on the gate insulating layer;
   an interlayer insulating layer on the gate electrode; and
   a first insulating layer on the interlayer insulating layer, and
   wherein the source electrode and the drain electrode are on the first insulating layer.

6. The display device of claim 5,
   wherein each of the inorganic insulating patterns comprises at least two of the buffer layer, the gate insulating layer, and the interlayer insulating layer.

7. The display device of claim 5, further comprising a third organic insulating layer between the inorganic insulating patterns and the wiring lines,
wherein a concavo-convex surface of the third organic insulating layer is between the inorganic insulating patterns and the wiring lines.

8. The display device of claim 7,
wherein the first insulating layer is a same layer as the third organic insulating layer.

9. The display device of claim 7,
wherein the first insulating layer is a different layer from the third organic insulating layer.

10. The display device of claim 9,
wherein each of the inorganic insulating patterns comprises a portion of the first insulating layer.

11. The display device of claim 10,
wherein the portion of the first insulating layer is a top portion of the inorganic insulating patterns.

12. The display device of claim 4,
wherein an anode electrode of the emission element is disposed on the first organic insulating layer.

13. The display device of claim 12,
wherein an organic light emitting layer of the emission element is disposed on the anode electrode.

14. The display device of claim 13,
wherein a cathode electrode of the emission element is disposed on the organic light emitting layer and the second organic insulating layer.

15. The display device of claim 4, further comprising a protective layer covering the wiring lines, the source electrode, and the drain electrode.

16. The display device of claim 1,
wherein each of the inorganic insulating patterns overlaps only one of the wiring lines.

17. The display device of claim 1,
wherein each of the inorganic insulating patterns overlaps at least two of the wiring lines.

18. The display device of claim 1,
wherein at least two of the inorganic insulating patterns have a common bottom layer.

19. The display device of claim 18,
wherein each of the at least two of the inorganic insulating patterns has a top layer on the common bottom layer, the top layer of each of the at least two of the inorganic insulating patterns being spaced apart from the top layer of another one of the at least two of the inorganic insulating patterns.

20. The display device of claim 19,
wherein at least one of the wiring lines is commonly on the top layer of each of the at least two of the inorganic insulating patterns.

21. The display device of claim 1,
wherein the wiring lines are disposed between the inorganic insulating patterns and the first organic insulating layer.

22. The display device of claim 1,
wherein the substrate further comprises a first area including a plurality of pixels and a second area including a driver providing signals to the plurality of pixels, and
wherein the bent area is disposed between the first area and the second area.

23. The display device of claim 22,
wherein the first area and the second area face each other.

24. The display device of claim 1, wherein the first organic insulating layer is in contact with a portion of the second organic insulating layer overlapping the inorganic insulating patterns.

* * * * *